United States Patent
Li et al.

(10) Patent No.: US 10,804,345 B2
(45) Date of Patent: Oct. 13, 2020

(54) ORGANIC LIGHT EMITTING DIODE DISPLAY APPARATUS

(71) Applicant: Au Optronics Corporation, Hsinchu (TW)

(72) Inventors: Chun-Yu Li, Hsinchu (TW); Ya-Pei Kuo, Hsinchu (TW); Tsu-Wei Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/420,185

(22) Filed: May 23, 2019

(65) Prior Publication Data

US 2019/0393284 A1   Dec. 26, 2019

Related U.S. Application Data

(60) Provisional application No. 62/688,635, filed on Jun. 22, 2018.

(30) Foreign Application Priority Data

Nov. 30, 2018   (TW) .............................. 107142834 A

(51) Int. Cl.
   *H01L 27/32*   (2006.01)
   *H01L 51/00*   (2006.01)

(52) U.S. Cl.
   CPC ........ *H01L 27/3246* (2013.01); *H01L 27/326* (2013.01); *H01L 27/3248* (2013.01); *H01L 51/0005* (2013.01)

(58) Field of Classification Search
   CPC . H01L 27/3246; H01L 27/3244; H01L 27/32; H01L 27/3248; H01L 27/326; H01L 51/0005; H01L 51/5209; H01L 51/5203; H01L 51/5012; H01L 2251/558; H01L 2251/50
   See application file for complete search history.

(56) References Cited

U.S. PATENT DOCUMENTS 10,347,871 B2    7/2019  Joung et al.
2005/0285509 A1* 12/2005 Funamoto ........... H01L 51/5275
                                              313/504
2008/0019167 A1*  1/2008 Doan .................. H01L 27/2463
                                              365/148

(Continued)

FOREIGN PATENT DOCUMENTS

CN   101681997   3/2010
CN   105514144   4/2016

(Continued)

*Primary Examiner* — Galina G Yushina
(74) *Attorney, Agent, or Firm* — JCIPRNET

(57) ABSTRACT

An organic light emitting diode display apparatus includes a substrate and a pixel structure disposed on the substrate. The pixel structure includes an active element, a first electrode electrically connected to the active element, a bank layer disposed on the first electrode, a light emitting layer disposed on the first electrode and an opening of the bank layer, and a second electrode disposed on the light emitting layer. The first electrode has a first region and a plurality of protrusions disposed outside the first region. The opening of the bank layer overlaps with the first region and the protrusions of the first electrode.

18 Claims, 24 Drawing Sheets

(56) References Cited

U.S. PATENT DOCUMENTS

| | | |
|---|---|---|
| 2010/0181554 A1 | 7/2010 | Yoshida et al. |
| 2014/0138642 A1* | 5/2014 | Kim .................... H01L 51/5209 |
| | | 257/40 |
| 2014/0168582 A1* | 6/2014 | Chang ............... G02F 1/134309 |
| | | 349/106 |
| 2017/0084676 A1 | 3/2017 | Jang et al. |
| 2017/0155094 A1 | 6/2017 | Joung et al. |
| 2018/0006259 A1 | 1/2018 | Paek et al. |
| 2018/0190932 A1* | 7/2018 | Koo .................... H01L 51/5209 |
| 2018/0247987 A1 | 8/2018 | Jang et al. |
| 2019/0067381 A1* | 2/2019 | Kim .................... H01L 51/5012 |
| 2019/0097177 A1* | 3/2019 | Choi ................. H01L 31/02366 |
| 2019/0165323 A1* | 5/2019 | Jo ....................... H01L 27/3258 |

FOREIGN PATENT DOCUMENTS

| | | |
|---|---|---|
| CN | 106784362 | 5/2017 |
| CN | 107565034 | 1/2018 |
| TW | 201813084 | 4/2018 |

* cited by examiner

ORGANIC LIGHT EMITTING DIODE DISPLAY APPARATUS

CROSS-REFERENCE TO RELATED APPLICATION

This application claims the priority benefit of U.S. provisional application Ser. No. 62/688,635, filed on Jun. 22, 2018, and Taiwan application serial no. 107142834, filed on Nov. 30, 2018. The entirety of each of the above-mentioned patent applications is hereby incorporated by reference herein and made a part of this specification.

BACKGROUND

Technical Field

The invention relates to a display apparatus. More particularly, the invention relates to an organic light emitting diode display apparatus.

Description of Related Art

With technology advancement, the ink jet printing (IJP) process is adopted to form a light emitting layer during the manufacturing process of an organic light emitting diode display apparatus. In the ink jet printing process, a fluid drop is injected into the opening defined by the bank layer to form the light emitting layer. Nevertheless, the film thickness of the light emitting layer formed in the opening of the bank layer is not uniform, and display quality is thereby affected. Specifically, the film thickness of the light emitting layer around the opening of the bank layer is greater than the film thickness of the light emitting layer inside the opening of the bank layer. As such, when an image is displayed, color difference between the color corresponding to the region around the opening of the bank layer and the color corresponding to the region inside the opening of the bank layer is significantly great, and that optical performance of the organic light emitting diode display apparatus is affected.

SUMMARY

The invention provides an organic light emitting diode display apparatus capable of providing favorable optical performance.

An organic light emitting diode display apparatus in an embodiment of the invention includes a substrate and a plurality of pixel structures disposed on the substrate. At least one of the pixel structures includes an active element, a first electrode, a bank layer, a light emitting layer, and a second electrode. The first electrode is electrically connected to the active element and has a first region and a plurality of protrusions disposed outside the first region. The bank layer is disposed on the first electrode and has an opening and a side wall defining the opening. The opening of the bank layer overlaps with the first region and the protrusions of the first electrode. The light emitting layer is disposed on the first electrode and the opening of the bank layer. The light emitting layer includes a first portion and a second portion. The first portion is disposed on the first region of the first electrode. The second portion of the light emitting layer is disposed between the protrusions of the first electrode and the side wall of the bank layer. A film thickness of the second portion of the light emitting layer is greater than a film thickness of the first portion of the light emitting layer. The second electrode is disposed on the light emitting layer.

To sum up, the first electrode of the organic light emitting diode display apparatus provided by an embodiment of the invention includes the plurality of protrusions. Micro gaps are formed between the protrusions of the first electrode and the side wall of the bank layer. Through the capillarity effect of the micro gaps, an increasing amount of fluid drops configured to form the light emitting layer is kept inside the micro gaps, so that the film thickness of the portion of the light emitting layer near the side wall of the bank layer is reduced. In this way, the light emitting layer may exhibit a relatively uniform film thickness, and the organic light emitting diode display apparatus may therefore feature favorable optical performance.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
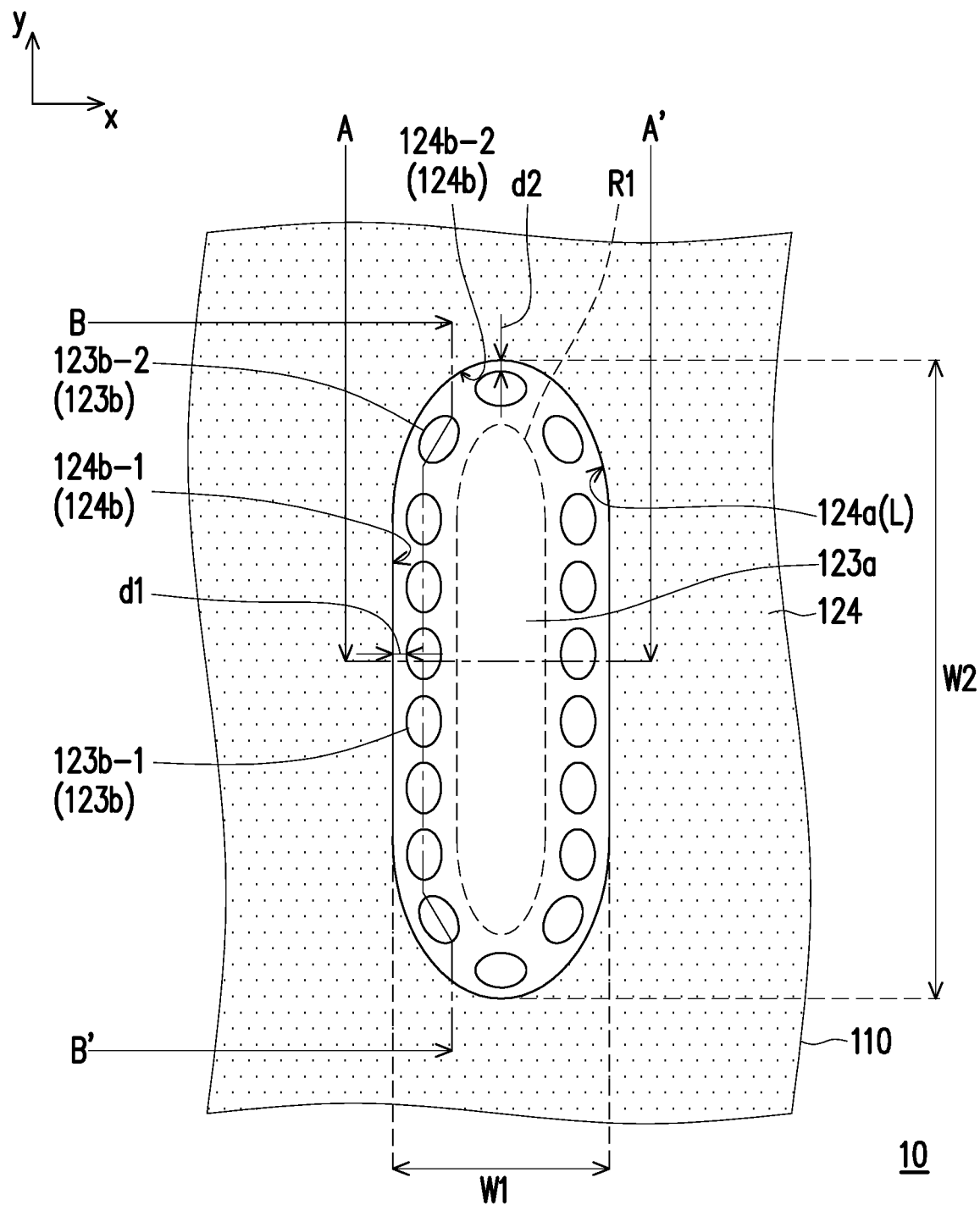
FIG. 1 is a schematic top view of an organic light emitting diode display apparatus according to an embodiment of the invention.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (or coupled). Therefore, the electrical connection (or coupling) between two devices may include intervening elements existing between the two devices.

The terms used herein such as "about", "approximate", or "substantial" include a related value and an average within an acceptable deviation range of specific values determined by those with ordinary skills in the art with consideration of discussed measurement and a specific number of errors related to the measurement (i.e., a limitation of a measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about", "approximately", or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the invention and will not be interpreted in an idealized or overly formal sense unless expressly so defined herein.

Exemplary embodiments are described herein with reference to schematic cross-sectional views illustrating idealized embodiments. Hence, variations of shapes resulting from manufacturing technologies and/or tolerances, for instance, are to be expected. Hence, the embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. Therefore, the regions shown in the drawings are schematic in nature, and their shapes are not intended to show the exact shape of the regions, and are not intended to limit the scope of the claims.

Descriptions of the invention are given with reference to the exemplary embodiments illustrated by the accompanying drawings. Wherever possible, the same reference numbers are used in the drawings and the description to refer to the same or like parts.

Figure 2:
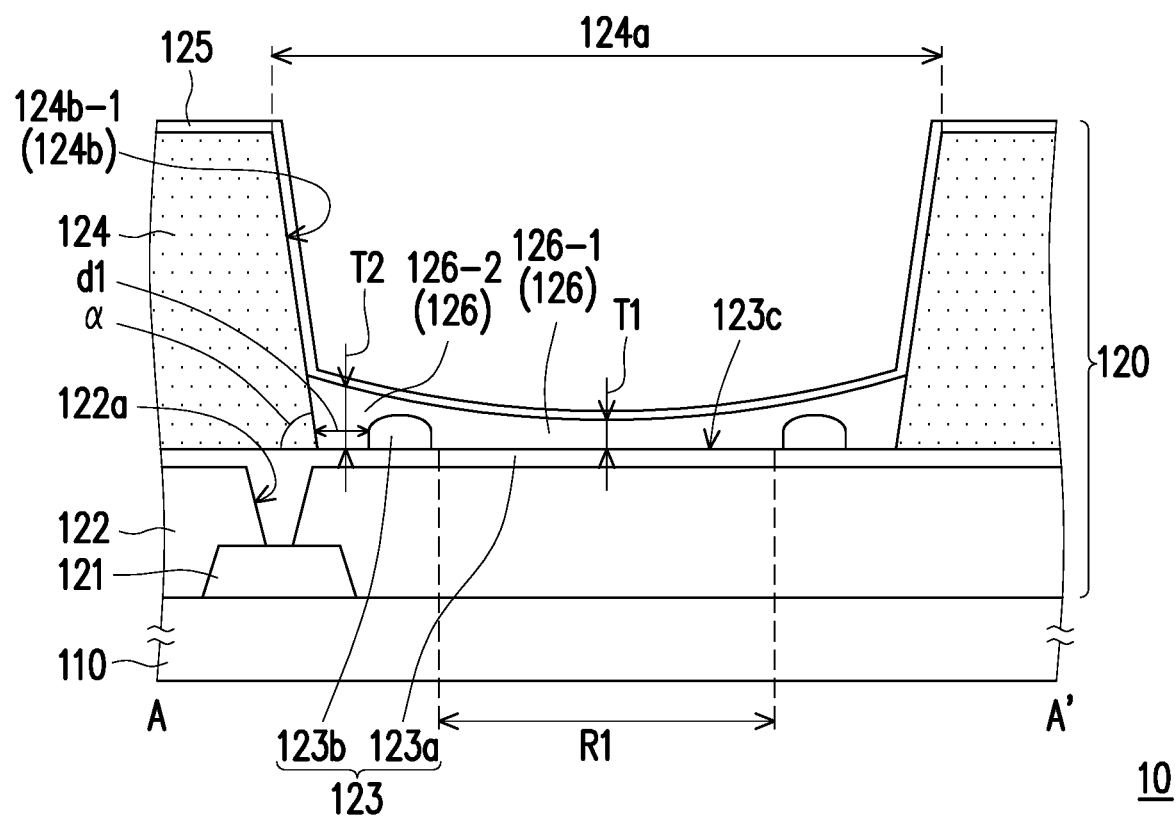
FIG. 2 is a schematic cross-sectional view illustrating the organic light emitting diode display apparatus taken along a cross-sectional line A-A' in FIG. 1.
Figure 3:
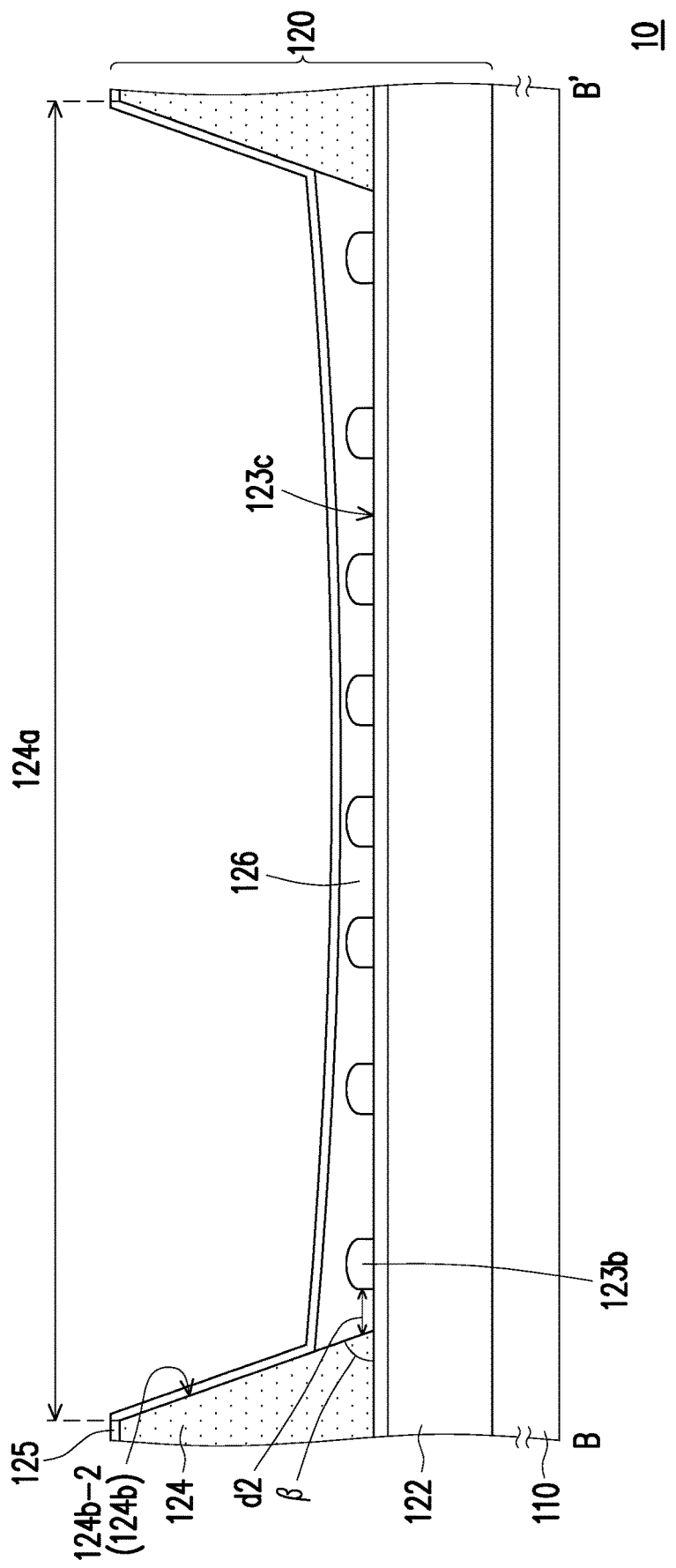
FIG. 3 is a schematic cross-sectional view illustrating the organic light emitting diode display apparatus taken along a cross-sectional line B-B' in FIG. 1.

FIG. 1 is a schematic top view of an organic light emitting diode display apparatus according to an embodiment of the invention. FIG. 2 is a schematic cross-sectional view illustrating the organic light emitting diode display apparatus taken along a cross-sectional line A-A' in FIG. 1. FIG. 3 is a schematic cross-sectional view illustrating the organic light emitting diode display apparatus taken along a cross-sectional line B-B' in FIG. 1. For clarity, illustration of a light emitting layer 126 and a second electrode 125 shown in FIG. 2 and FIG. 3 is omitted in FIG. 1.

With reference to FIG. 1, FIG. 2, and FIG. 3, an organic light emitting diode display apparatus 10 includes a substrate 110 and a plurality of pixel structures 120 disposed on the substrate 110. In FIG. 1, FIG. 2, and FIG. 3, only one pixel structure 120 is depicted to serve as an example. People having ordinary skill in the art should be able to achieve the organic light emitting diode display apparatus 10 according to the specification and drawings, so that the plurality of pixel structures 120 are not depicted one by one.

In this embodiment, the substrate 110 may be a soft substrate, a rigid substrate, or a combination of the foregoing. For instance, a material of the soft substrate may be polyimide (PI), polyethylene terephthalate (PET), or other suitable materials, and a material of the rigid substrate may be glass, quartz, or other suitable materials. Nevertheless, the invention should not be construed as limited thereto.

The pixel structure 120 includes an active element 121 and a first electrode 123 electrically connected to the active element 121. For instance, in this embodiment, the active element 121 includes a thin film transistor, and the first electrode 123 is electrically connected to a drain of the thin film transistor. In this embodiment, the pixel structure 120 may further selectively include an insulation layer 122 disposed between the first electrode 123 and the substrate 110. The insulation layer 122 covers the active element 121, and the first electrode 123 is disposed on the insulation layer 121. The insulation layer 122 has a contact window 122a, and the first electrode 123 may be electrically connected to the active element 121 through the contact window 122a. Nevertheless, the invention should not be construed as limited thereto. According to other embodiments, the electrode 123 may be electrically connected to the active element 121 through other suitable manners.

The first electrode 123 has a first region R1 and a plurality of protrusions 123b disposed outside the first region R1. For instance, in this embodiment, the first electrode 123 includes a planarization portion 123a disposed on the insulation layer 122 and the plurality of protrusions 123b disposed on the planarization portion 123a, and the first region R1 of the first electrode 123 may be a portion of the planarization portion 123a. In this embodiment, the planarization portion 123a and the protrusions 123b may selectively be formed through a half tone mask. That is, in this embodiment, the planarization portion 123a and the protrusions 123b may selectively be integrally formed, and a material of the planarization portion 123a and a material of the protrusions 123b may be an identical conductive material. Nevertheless, the invention should not be construed as limited thereto. According to other embodiments, different masks can be used to form the planarization portion 123a and the protrusions 123b separately. That is, in other embodiments, the planarization portion 123a and the protrusions 123b of the first electrode 123 may not be integrally formed, and the material of the planarization portion 123a and the material of the protrusions 123b may be the same conductive material or may be different conductive materials.

In this embodiment, vertical projections of the protrusions 123b on the substrate 110 may be a plurality of ellipses. Nevertheless, the invention should not be construed as limited thereto. According to other embodiments, the vertical projections of the protrusions 123b on the substrate 110 may be other suitable shapes, and description thereof accompanied with drawings is provided in the following paragraphs.

The pixel structure 120 further includes a bank layer 124 disposed on the first electrode 123. The bank layer 124 has an opening 124a and a side wall 124b defining the opening 124a. The opening 124a of the bank layer 124 overlaps with the first region R1 of the first electrode 123 and the protrusions 123b of the first electrode 123. In this embodiment, a boundary edge L (shown in FIG. 1) is provided between the side wall 124b of the bank layer 124 and a surface 123c of the first electrode 123, and the protrusions 123b of the first electrode 123 are disposed at intervals along the boundary edge L. That is, the protrusions 123b of the first electrode 123 are disposed around the opening 124a instead of being disposed in the middle of the opening 124a. For instance, in this embodiment, a material of the bank layer 124 may be a photoresist material or other suitable materials, which should however not be construed as limitations to the invention.

The opening 124a of the bank layer 124 has a first width W1 in a first direction x, the opening 124a of the bank layer 124 has a second width W2 in a second direction y, and the first direction x intersects with the second direction y. In this embodiment, the first width W1 and the second width W2 may selectively be different. In this embodiment, the opening 124a of the bank layer 124 may be an elliptical opening. A short axis of the elliptical opening is located in the first direction x, and a long axis of the elliptical opening is located in the second direction y. Nevertheless, the invention should not be construed as limited thereto. According to other embodiments, the opening 124a of the bank layer 124 may also be shaped as other suitable shapes.

In this embodiment, the side wall 124b of the bank layer 124 may include a first portion 124b-1 and a second portion 124b-2. The first portion 124b-1 of the side wall 124b is located in the first direction x, and the second portion 124b-2 of the side wall 124b is located in the second direction y. For instance, in this embodiment, a first included angle α is provided between the first portion 124b-1 of the side wall 124b and the surface 123c of the first electrode 123, a second included angle β is provided between the second portion 124b-2 of the side wall 124b and the surface 123c of the first electrode 123, and the first included angle α is greater than the second included angle β. That is, the first portion 124b-1 of the side wall 124b of the bank layer 124 is relatively steep, and the second portion 124b-2 of the side wall 124b of the bank layer 124 is relatively flat, which should however not be construed as limitations to the invention.

The protrusions 123b are spaced apart from the side wall 124b of the bank layer 124 by appropriate distances d1 and d2. For instance, in this embodiment, the protrusions 123b include a plurality of protrusions 123b-1 disposed adjacent to the first portion 124b-1 of the side wall 124b and a plurality of protrusions 123b-2 disposed adjacent to the second portion 124b-2 of the side wall 124b. One protrusion 123b-1 is spaced apart from the first portion 124b-1 of the side wall 124b by a first distance d1. One protrusion 123b-2 is spaced apart from the second portion 124b-2 of the side wall 124b by a second distance d2. In this embodiment, the first distance d1 may substantially be equal to the second distance d2. Nevertheless, the invention should not be construed as limited thereto. According to other embodiments, the first distance d1 may not be equal to the second distance d2, and description thereof accompanied with drawings is provided in the following paragraphs.

The pixel structure 120 further includes the light emitting layer 126 disposed on the first electrode 123 and the opening 124a of the bank layer 124. The light emitting layer 126 includes a first portion 126-1 and a second portion 126-2. The first portion 126-1 of the light emitting layer 126 is disposed on the first region R1 of the first electrode 123. That is, the first portion 126-1 of the light emitting layer 126 is disposed on the planarization portion 123a of the first electrode 123. The second portion 126-2 of the light emitting layer 126 is disposed between the protrusions 123b of the first electrode 123 and the side wall 124b of the bank layer 124. In particular, a film thickness T2 of the second portion 126-2 of the light emitting layer 126 is greater than a film thickness T1 of the first portion 126-1 of the light emitting layer 126. That is, the light emitting layer 126 is formed by inject printing.

The pixel structure 120 further includes a second electrode 125 disposed on the light emitting layer 126. The light emitting layer 126 may also be called as an organic electroluminescent layer, and a potential difference between the first electrode 123 and the second electrode 125 may drive the organic electroluminescent layer (i.e., the light emitting layer 126) to emit light. For instance, in this embodiment, the organic light emitting diode display apparatus 10 may selectively be a top emission type, and the first electrode 123 may be a reflective electrode and the second electrode 125 may be a transparent electrode. Nevertheless, the invention should not be construed as limited thereto. According to another embodiment, the organic light emitting diode display apparatus 10 may selectively be a bottom emission type, the first electrode 123 may be a transparent electrode, and the second electrode 125 may be a reflective electrode. According to yet another embodiment, the organic light emitting diode display apparatus 10 may also selectively be a dual-side emission type, and the first electrode 123 and the second electrode 125 may both be transparent electrodes.

It is worth noting that the light emitting layer 126 may have a relatively uniform film thickness owing to the plurality of protrusions 123b of the first electrode 123, so that the organic light emitting diode display apparatus 10 may exhibit favorable optical performance. Specifically, micro gaps are provided between the protrusions 123b of the first electrode 123 and the side wall 124b of the bank layer 124. When the light emitting layer 126 is formed through inject printing, an increasing amount of fluid drops (i.e., the material used to form the light emitting layer 126) is kept inside the micro gaps thanks to the capillarity effect generated by the micro gaps between the protrusions 123b and the side wall 124b of the bank layer 124, so that the film thickness T2 of the second portion 126-2 of the light emitting layer 126 is reduced. In this way, a difference between the film thickness T2 of the second portion 126-2 of the light emitting layer 126 and the film thickness T1 of the first portion 126-1 of the light emitting layer 126 is reduced, and that overall film thickness of the light emitting layer 126 becomes more uniform.

Figure 4:
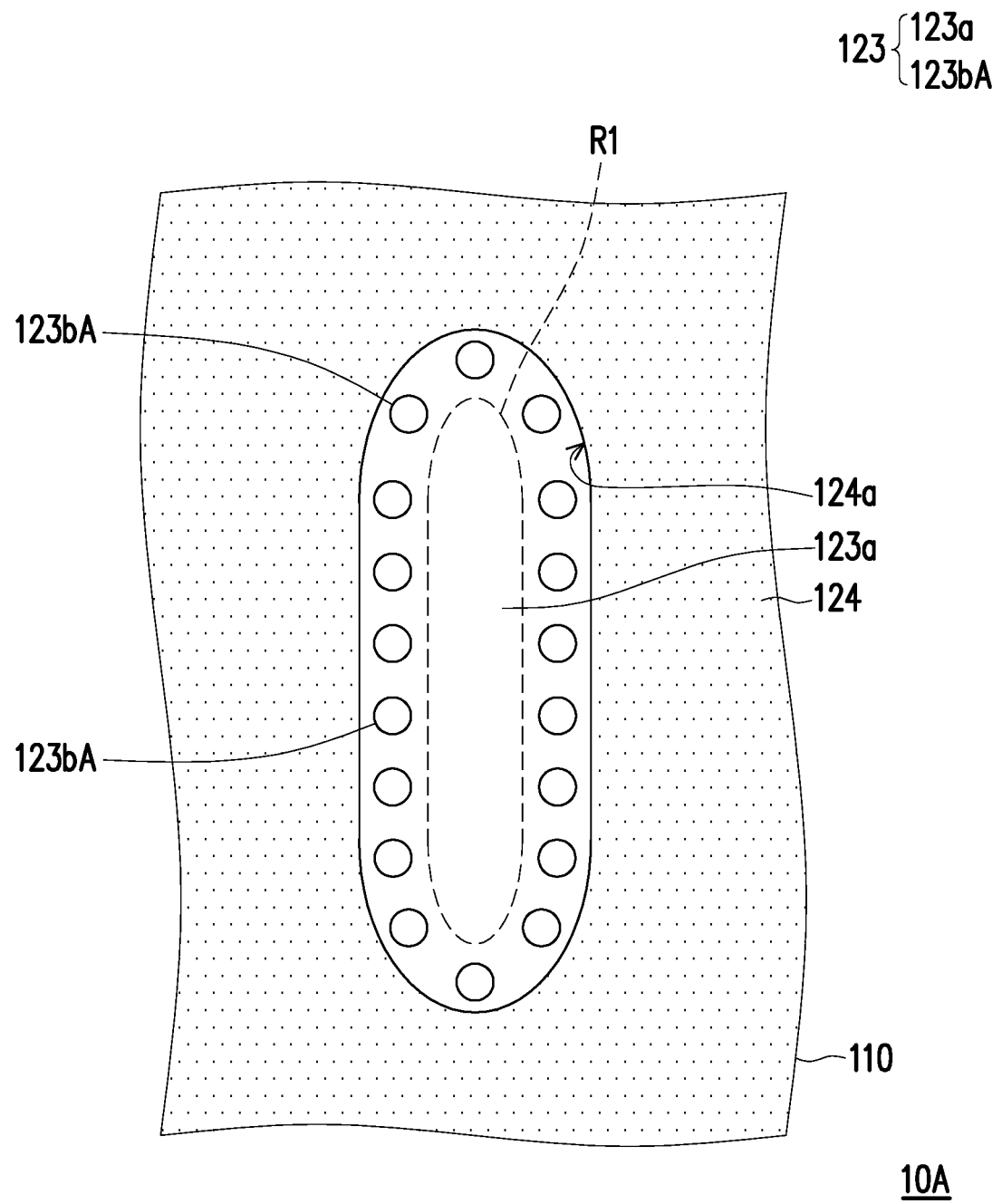
FIG. 4 is a schematic top view of an organic light emitting diode display apparatus according to an embodiment of the invention.

FIG. 4 is a schematic top view of an organic light emitting diode display apparatus according to an embodiment of the invention. For clarity, illustration of a light emitting layer and a second electrode of an organic light emitting diode display apparatus 10A is omitted in FIG. 4.

The organic light emitting diode display apparatus 10A of FIG. 4 is similar to the organic light emitting diode display apparatus 10 of FIG. 1, and a difference therebetween is that: protrusions 123bA of the organic light emitting diode display apparatus 10A of FIG. 4 and the protrusions 123b of the organic light emitting diode display apparatus 10 of FIG. 1 are different. With reference to FIG. 1 and FIG. 4, specifically, the vertical projections of the protrusions 123b on the substrate 110 are ellipses in FIG. 1, and vertical projections of the protrusions 123bA on the substrate 110 are a plurality of circles in FIG. 4.

Figure 5:
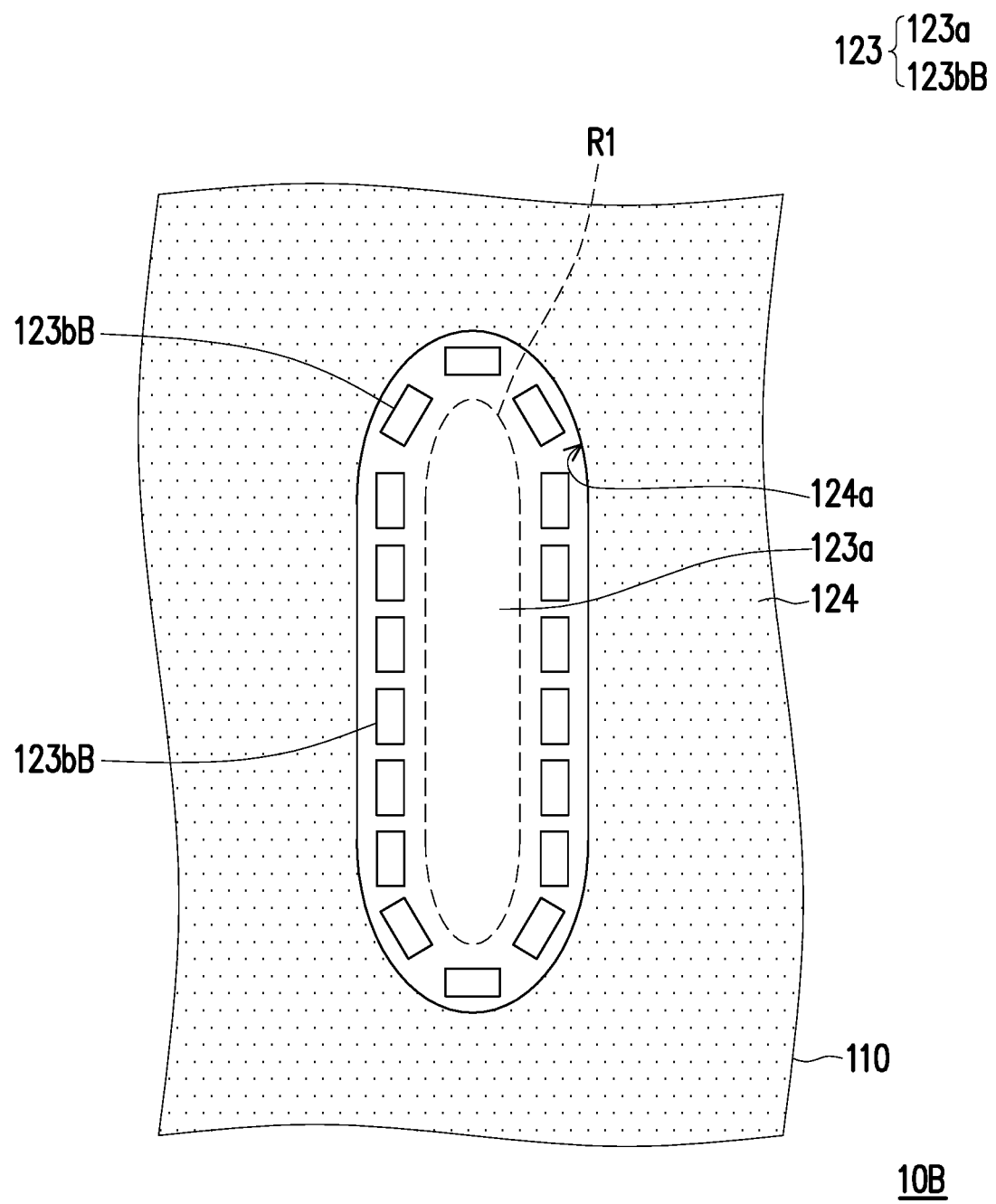
FIG. 5 is a schematic top view of an organic light emitting diode display apparatus according to an embodiment of the invention.

FIG. 5 is a schematic top view of an organic light emitting diode display apparatus according to an embodiment of the invention. For clarity, illustration of a light emitting layer and a second electrode of an organic light emitting diode display apparatus 10B is omitted in FIG. 5.

The organic light emitting diode display apparatus 10B of FIG. 5 is similar to the organic light emitting diode display apparatus 10 of FIG. 1, and a difference therebetween is that: protrusions 123bB of the organic light emitting diode display apparatus 10B of FIG. 5 and the protrusions 123b of the organic light emitting diode display apparatus 10 of FIG. 1 are different. With reference to FIG. 1 and FIG. 5, specifically, the vertical projections of the protrusions 123b on the substrate 110 are ellipses in FIG. 1, and vertical projections of the protrusions 123bB on the substrate 110 are a plurality of rectangles in FIG. 5.

Figure 6:
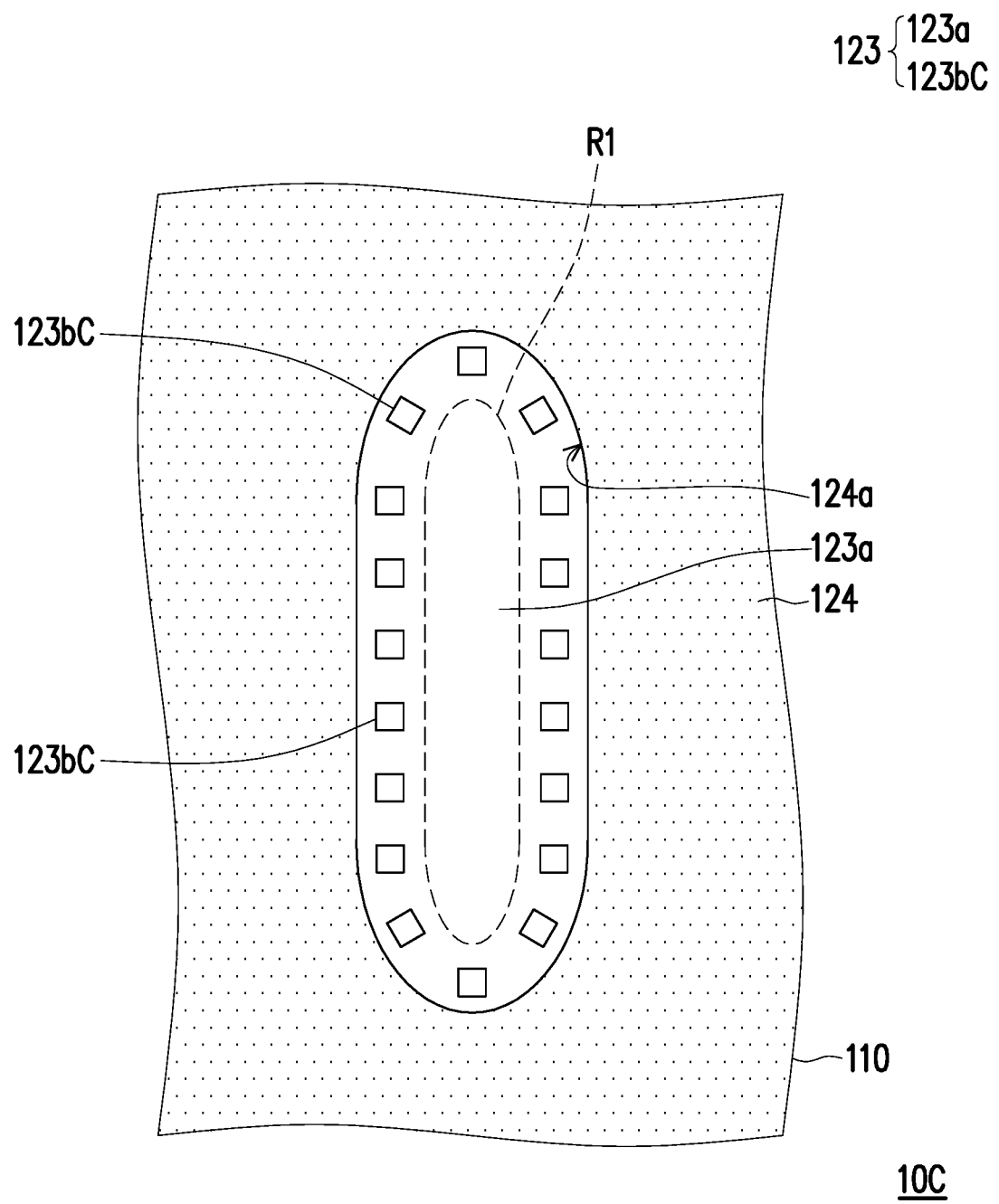
FIG. 6 is a schematic top view of an organic light emitting diode display apparatus according to an embodiment of the invention.

FIG. 6 is a schematic top view of an organic light emitting diode display apparatus according to an embodiment of the invention. For clarity, illustration of a light emitting layer and a second electrode of an organic light emitting diode display apparatus 10C is omitted in FIG. 6.

The organic light emitting diode display apparatus 10C of FIG. 6 is similar to the organic light emitting diode display apparatus 10 of FIG. 1, and a difference therebetween is that: protrusions 123bC of the organic light emitting diode display apparatus 10C of FIG. 6 and the protrusions 123b of the organic light emitting diode display apparatus 10 of FIG. 1 are different. With reference to FIG. 1 and FIG. 6, specifically, the vertical projections of the protrusions 123b on the substrate 110 are ellipses in FIG. 1, and vertical projections of the protrusions 123bC on the substrate 110 are a plurality of squares in FIG. 6.

Figure 7:
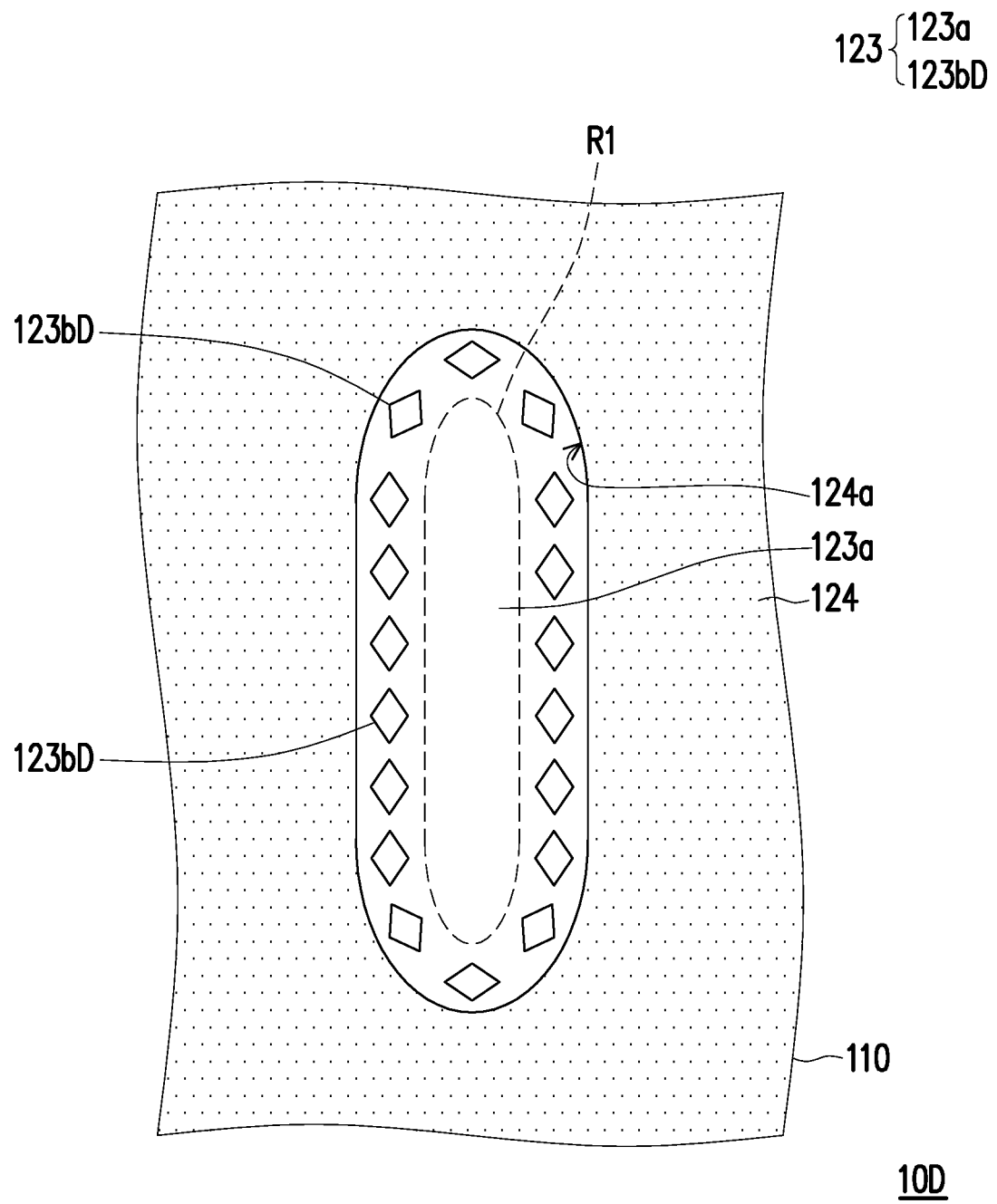
FIG. 7 is a schematic top view of an organic light emitting diode display apparatus according to an embodiment of the invention.

FIG. 7 is a schematic top view of an organic light emitting diode display apparatus according to an embodiment of the invention. For clarity, illustration of a light emitting layer and a second electrode of an organic light emitting diode display apparatus 10D is omitted in FIG. 7.

The organic light emitting diode display apparatus 10D of FIG. 7 is similar to the organic light emitting diode display apparatus 10 of FIG. 1, and a difference therebetween is that: protrusions 123bD of the organic light emitting diode display apparatus 10D of FIG. 7 and the protrusions 123b of the organic light emitting diode display apparatus 10 of FIG. 1 are different. With reference to FIG. 1 and FIG. 7, specifically, the vertical projections of the protrusions 123b on the substrate 110 are ellipses in FIG. 1, and vertical projections of the protrusions 123bD on the substrate 110 are a plurality of rhombuses in FIG. 7.

Figure 8:
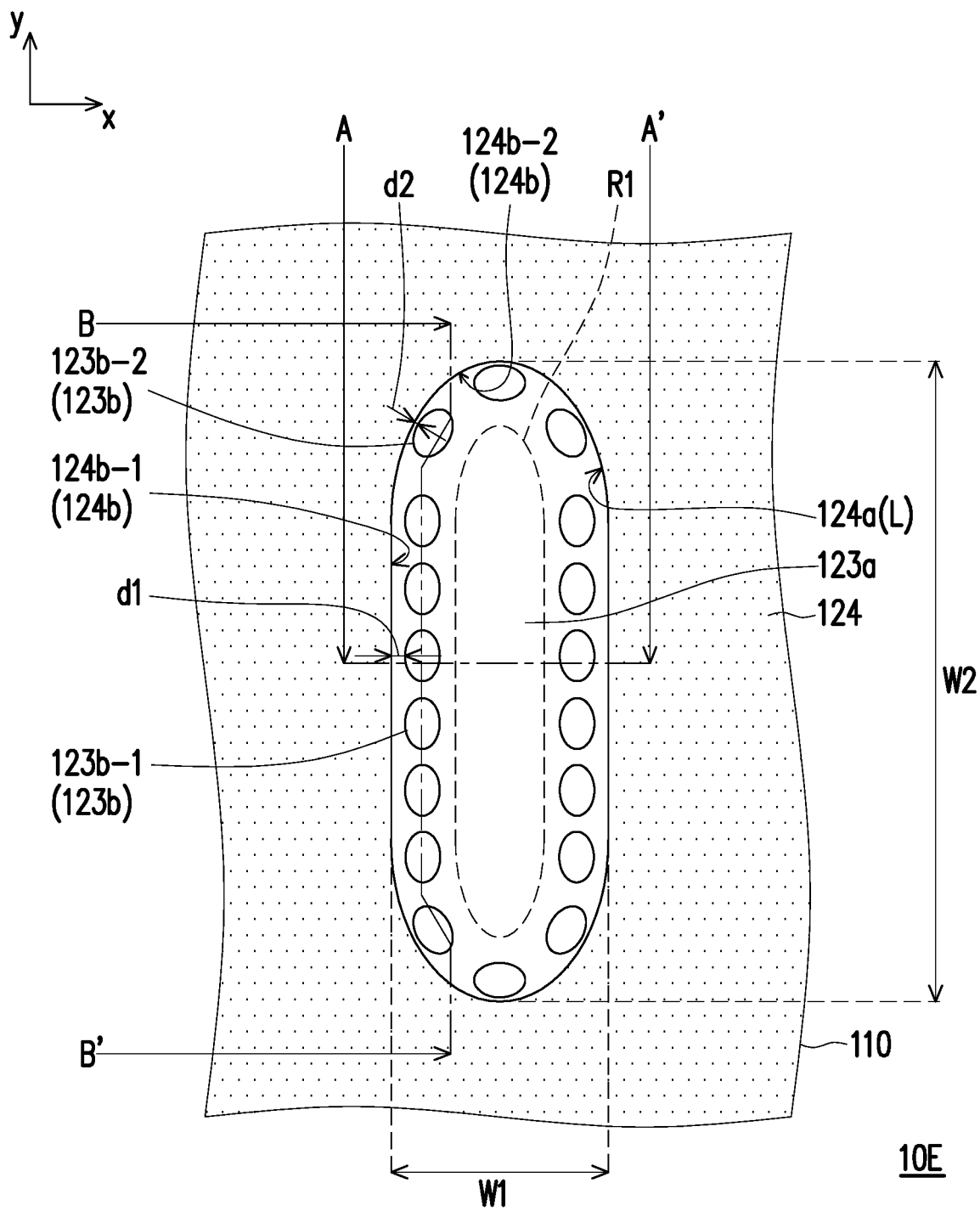
FIG. 8 is a schematic top view of an organic light emitting diode display apparatus according to an embodiment of the invention.
Figure 9:
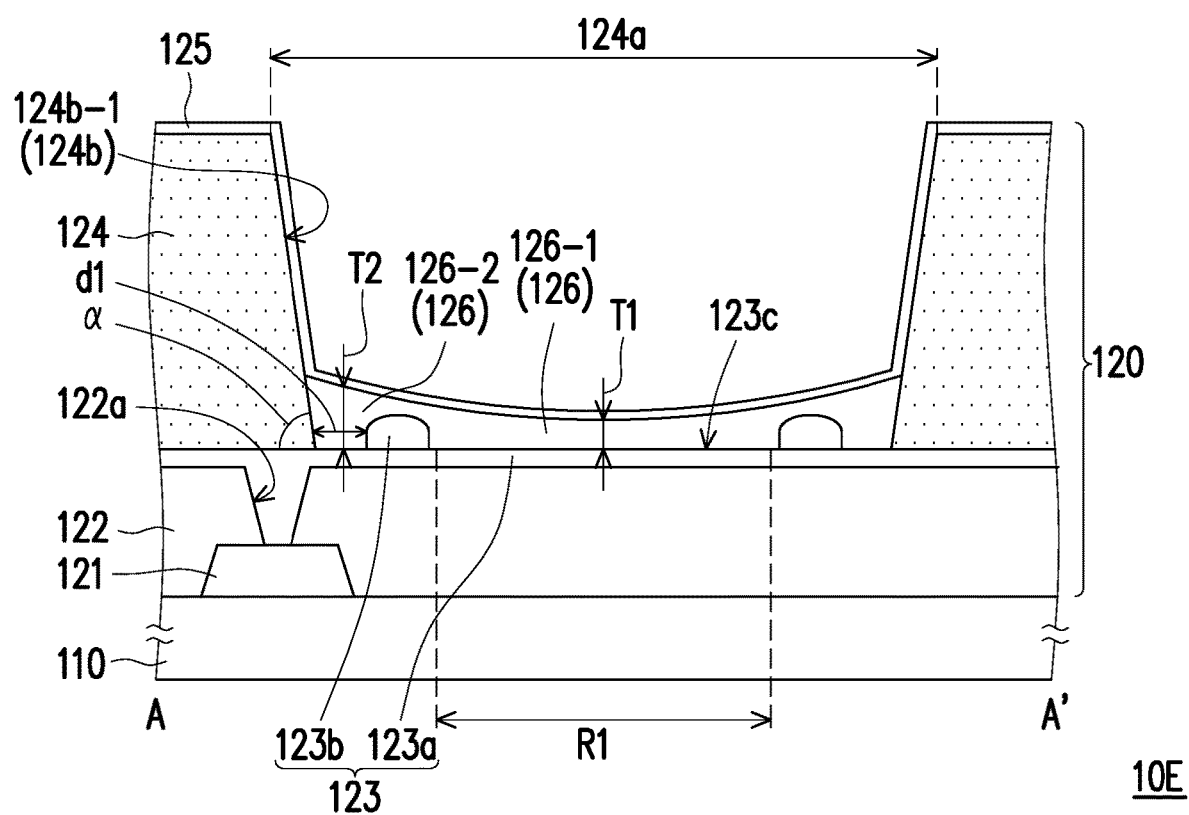
FIG. 9 is a schematic cross-sectional view illustrating the organic light emitting diode display apparatus taken along a cross-sectional line A-A' in FIG. 8.
Figure 10:
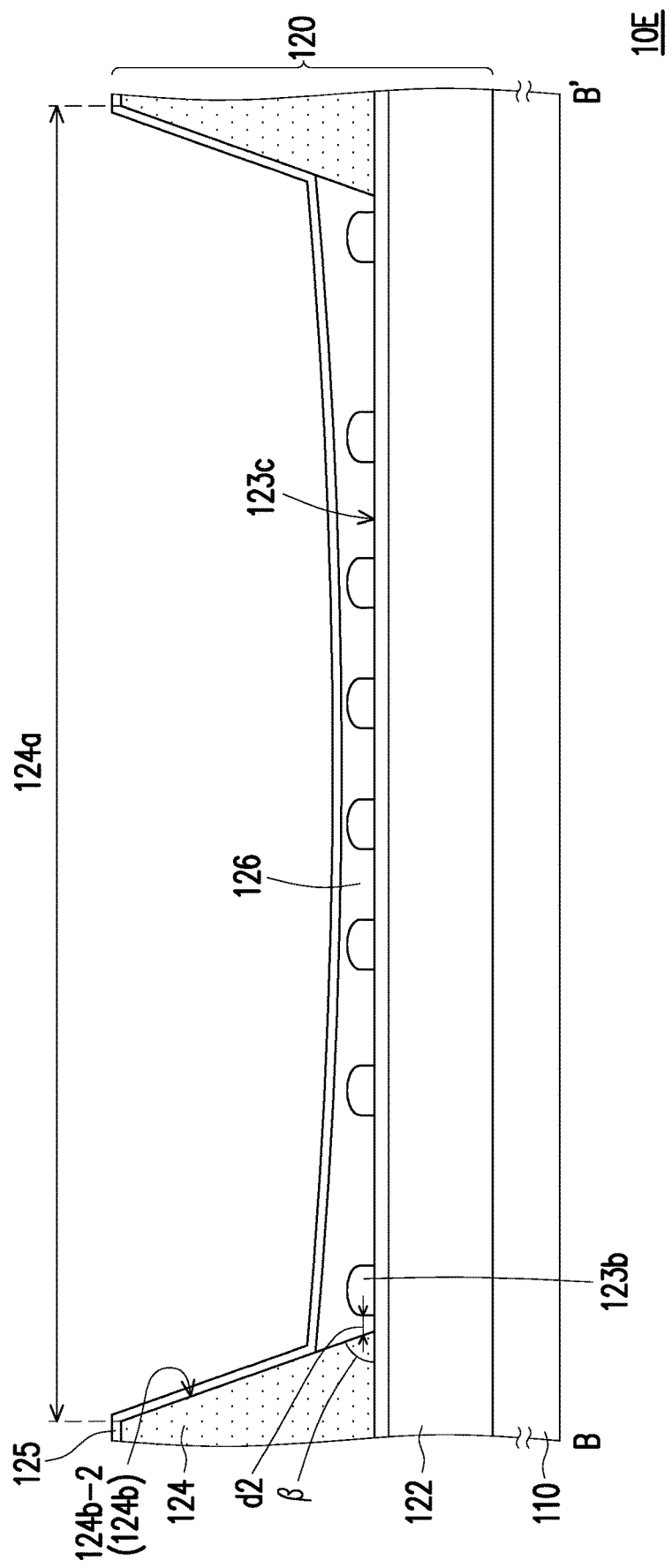
FIG. 10 is a schematic cross-sectional view illustrating the organic light emitting diode display apparatus taken along a cross-sectional line B-B' in FIG. 8.

FIG. 8 is a schematic top view of an organic light emitting diode display apparatus according to an embodiment of the invention. FIG. 9 is a schematic cross-sectional view illustrating the organic light emitting diode display apparatus taken along a cross-sectional line A-A' in FIG. 8. FIG. 10 is a schematic cross-sectional view illustrating the organic light emitting diode display apparatus taken along a cross-sectional line B-B' in FIG. 8. For clarity, illustration of the light emitting layer 126 and the second electrode 125 in FIG. 9 and FIG. 10 is omitted in FIG. 8.

An organic light emitting diode display apparatus 10E of FIG. 8, FIG. 9, and FIG. 10 is similar to the organic light emitting diode display apparatus 10 of FIG. 1, FIG. 2, and FIG. 3, and a difference therebetween is that: the second distance d2 is less than the first distance d1 in the organic light emitting diode display apparatus 10D. That is, the distance between the relatively steep second portion 124b-2 of the side wall 126b of the bank layer 124 and the protrusion 123b is longer, and the distance between the relatively flat first portion 124b-1 of the side wall 126b of the bank layer 124 and the protrusion 123b is shorter. The distance d2 between the protrusion 123b and the second portion 124b-2 of the side wall 124b is relatively short. As such, even though the second portion 124b-2 of the side wall 124b is relatively flat, micro gaps providing favorable capillarity effect can still be formed between the protrusion 123b and the second portion 124b-2 of the side wall 124b, so that uniformity of the film thickness of the light emitting layer 126 is improved, and optical performance of the organic light emitting diode display apparatus 10E is thereby enhanced.

Figure 11:
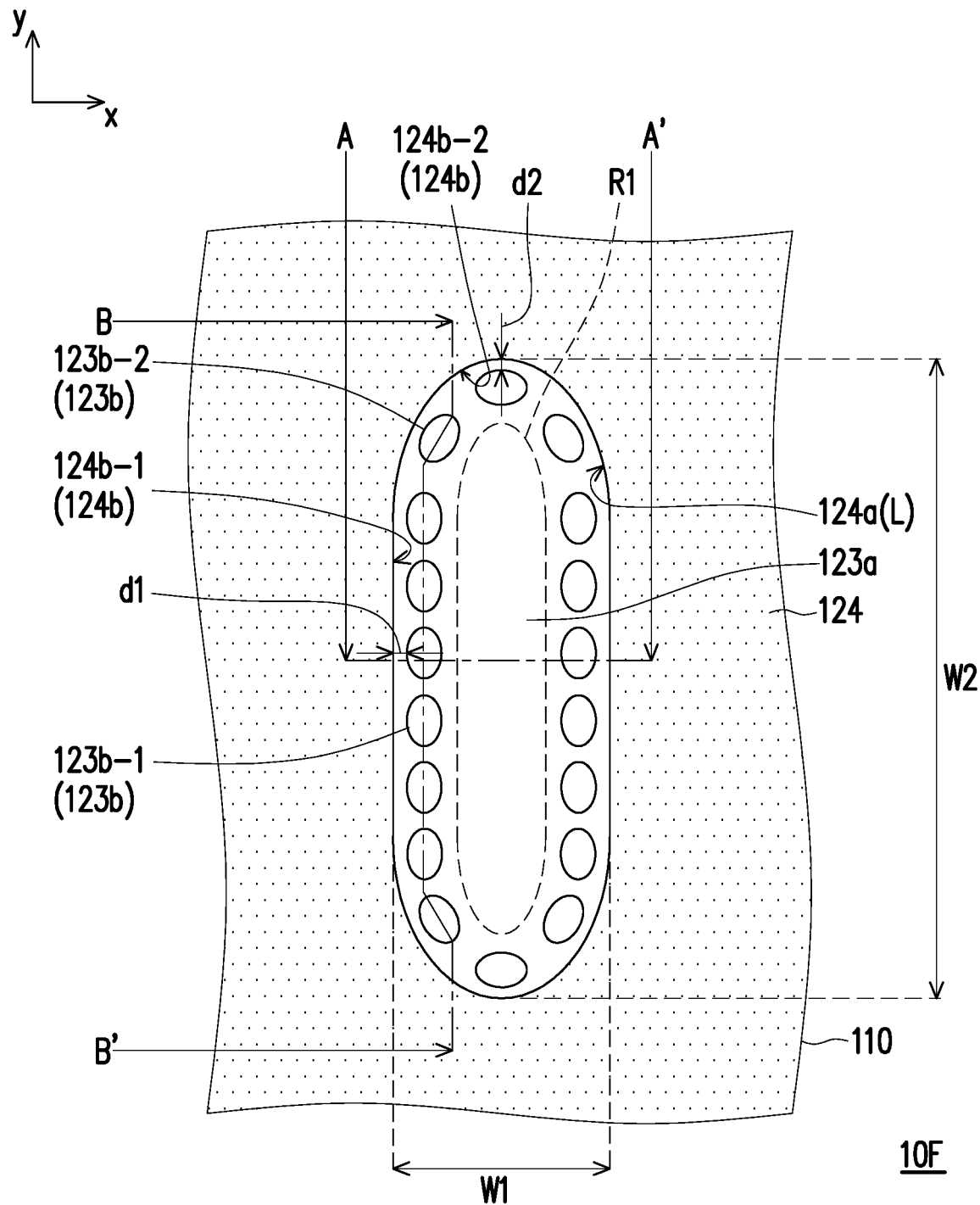
FIG. 11 is a schematic top view of an organic light emitting diode display apparatus according to an embodiment of the invention.
Figure 12:
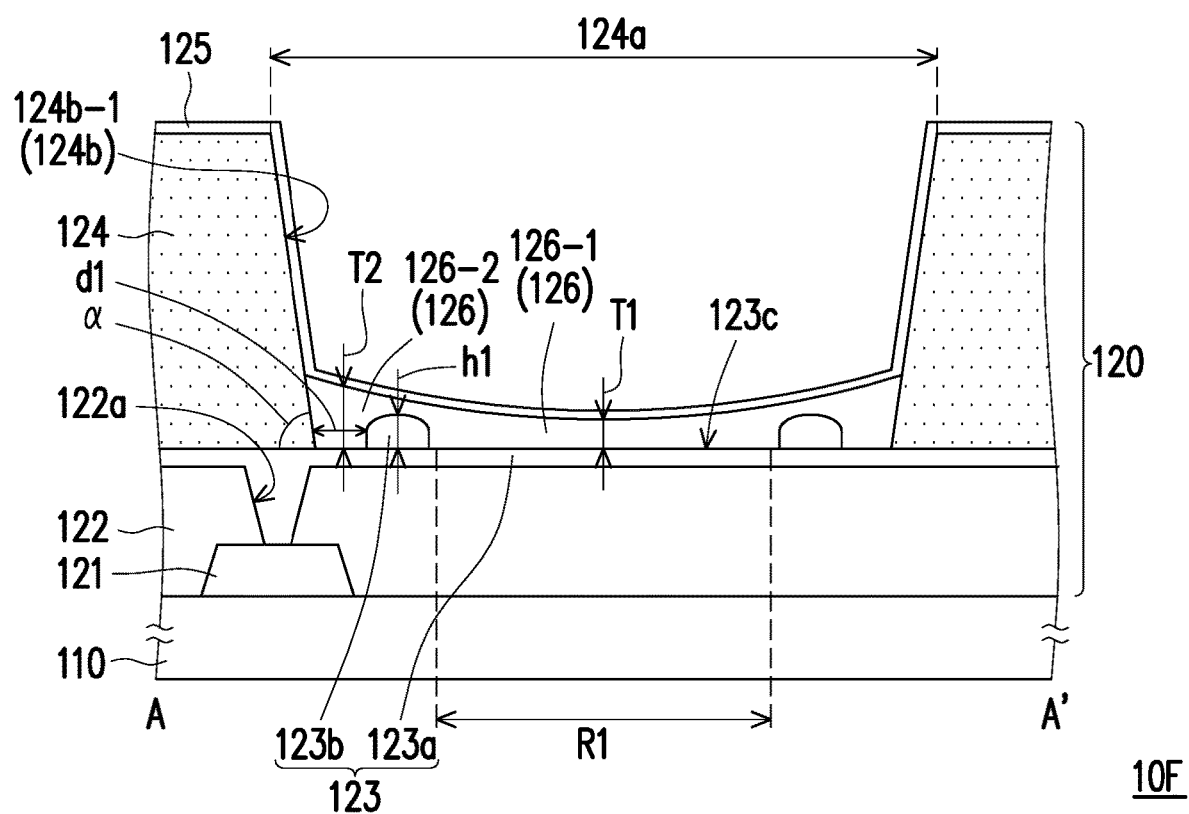
FIG. 12 is a schematic cross-sectional view illustrating the organic light emitting diode display apparatus taken along a cross-sectional line A-A' in FIG. 11.
Figure 13:
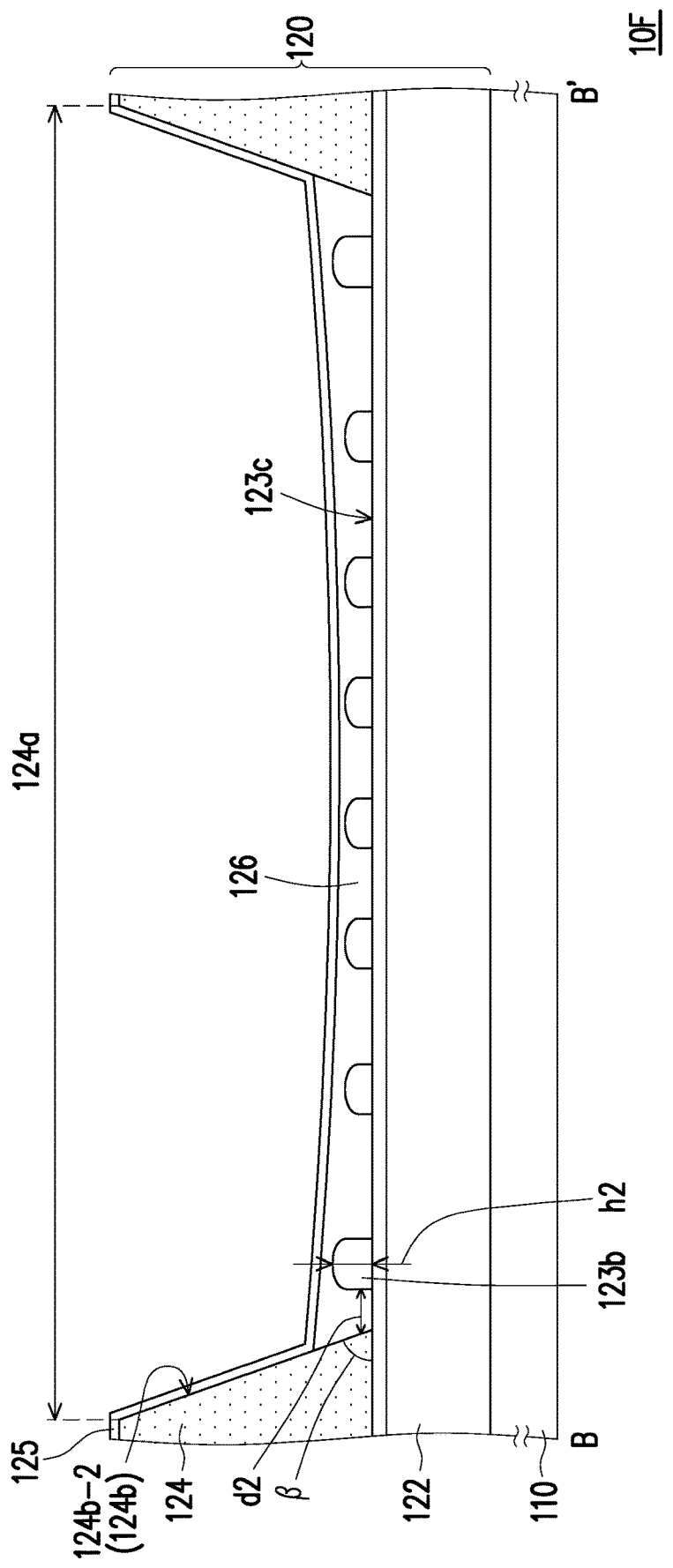
FIG. 13 is a schematic cross-sectional view illustrating the organic light emitting diode display apparatus taken along a cross-sectional line B-B' in FIG. 11.

FIG. 11 is a schematic top view of an organic light emitting diode display apparatus according to an embodiment of the invention. FIG. 12 is a schematic cross-sectional view illustrating the organic light emitting diode display apparatus taken along a cross-sectional line A-A' in FIG. 11. FIG. 13 is a schematic cross-sectional view illustrating the organic light emitting diode display apparatus taken along a cross-sectional line B-B' in FIG. 11. For clarity, illustration of the light emitting layer 126 and the second electrode 125 in FIG. 12 and FIG. 13 is omitted in FIG. 11.

An organic light emitting diode display apparatus 10F of FIG. 11, FIG. 12, and FIG. 13 is similar to the organic light emitting diode display apparatus 10 of FIG. 1, FIG. 2, and FIG. 3, and a difference therebetween is that: one of the plurality of protrusions 123b disposed adjacent to the first portion 126b-1 of the side wall 126b has a first height h1, another one of the plurality of protrusions 123b disposed adjacent to the second portion 126b-2 of the side wall 126b has a second height h2, and the second height h2 is greater than the first height h1 in the embodiment of FIG. 11, FIG. 12, and FIG. 13. That is, the protrusion 123b adjacent to the relatively flat second portion 124b-2 of the side wall 126b of the bank layer 124 has the greater height h2. In this way, even though the second portion 124b-2 of the side wall 126b is relatively flat, micro gaps providing favorable capillarity effect can still be formed between the protrusion 123b having greater height h2 and the second portion 124b-2 of the side wall 126b, so that uniformity of the film thickness of the light emitting layer 126 is improved, and optical performance of the organic light emitting diode display apparatus 10F is thereby enhanced.

Figure 14:
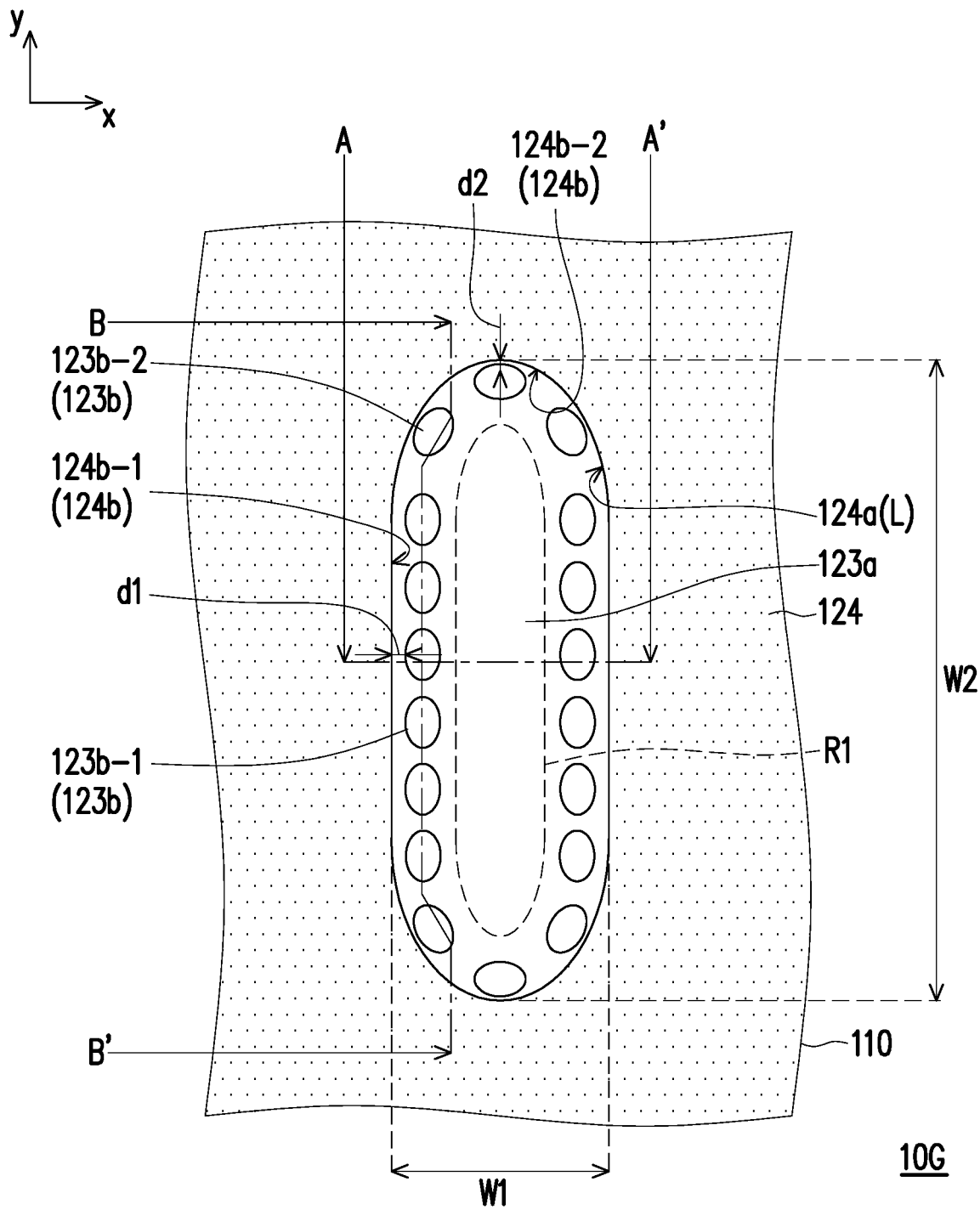
FIG. 14 is a schematic top view of an organic light emitting diode display apparatus according to an embodiment of the invention.
Figure 15:
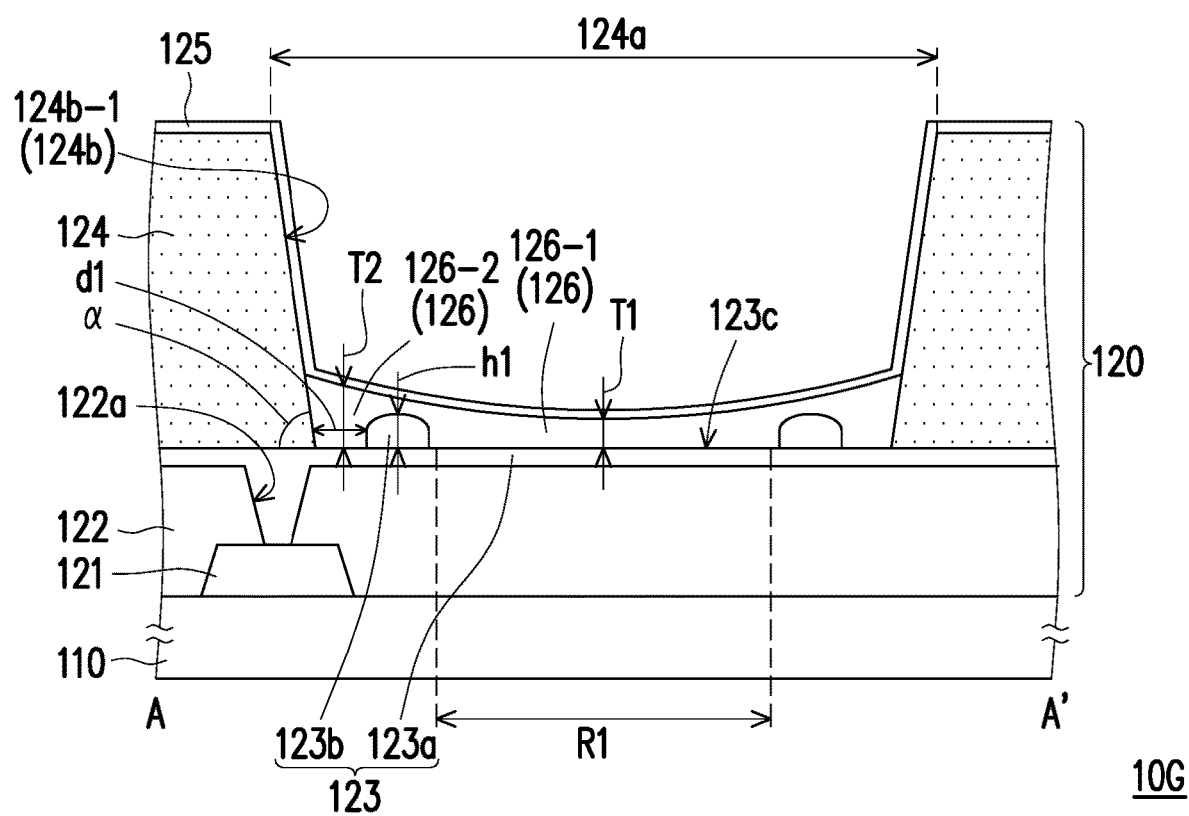
FIG. 15 is a schematic cross-sectional view illustrating the organic light emitting diode display apparatus taken along a cross-sectional line A-A' in FIG. 14.
Figure 16:
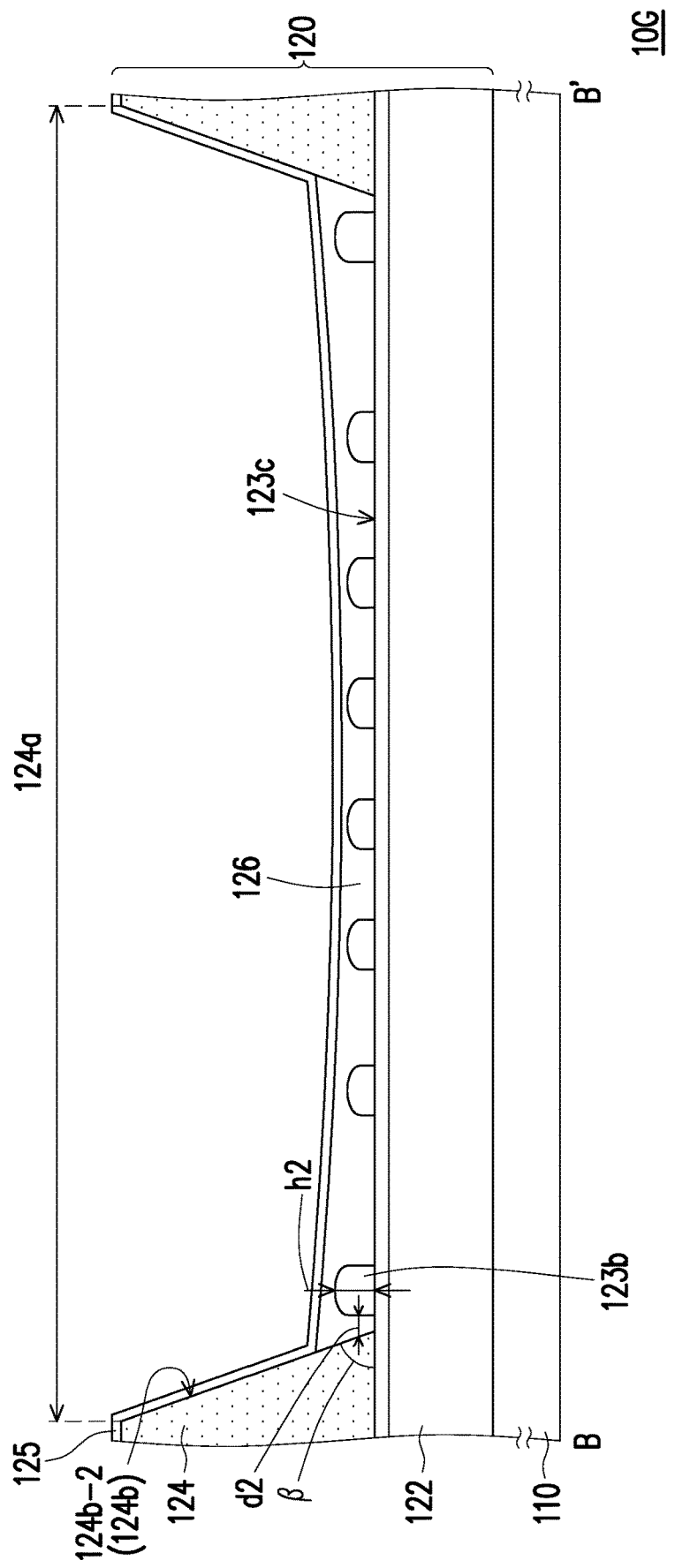
FIG. 16 is a schematic cross-sectional view illustrating the organic light emitting diode display apparatus taken along a cross-sectional line B-B' in FIG. 14.

FIG. 14 is a schematic top view of an organic light emitting diode display apparatus according to an embodiment of the invention. FIG. 15 is a schematic cross-sectional view illustrating the organic light emitting diode display apparatus taken along a cross-sectional line A-A' in FIG. 14. FIG. 16 is a schematic cross-sectional view illustrating the organic light emitting diode display apparatus taken along a cross-sectional line B-B' in FIG. 14. For clarity, illustration of the light emitting layer 126 and the second electrode 125 in FIG. 15 and FIG. 16 is omitted in FIG. 14.

An organic light emitting diode display apparatus 10G of FIG. 14, FIG. 15, and FIG. 16 is similar to the organic light emitting diode display apparatus 10 of FIG. 1, FIG. 2, and FIG. 3, and a difference therebetween is that: the second distance d2 is less than the first distance d1 in the organic light emitting diode display apparatus 10F, one of the plurality of protrusions 123b disposed adjacent to the first portion 126b-1 of the side wall 126b has the first height h1, another one of the plurality of protrusions 123b disposed adjacent to the second portion 126b-2 of the side wall 126b has the second height h2, and the second height h2 is greater than the first height h1 in the embodiment of FIG. 14, FIG. 15, and FIG. 16. The organic light emitting diode display apparatus 10G features the advantages of the organic light emitting diode display apparatus 10E and the organic light emitting diode display apparatus 10F, and related description is not repeated herein.

Figure 17:
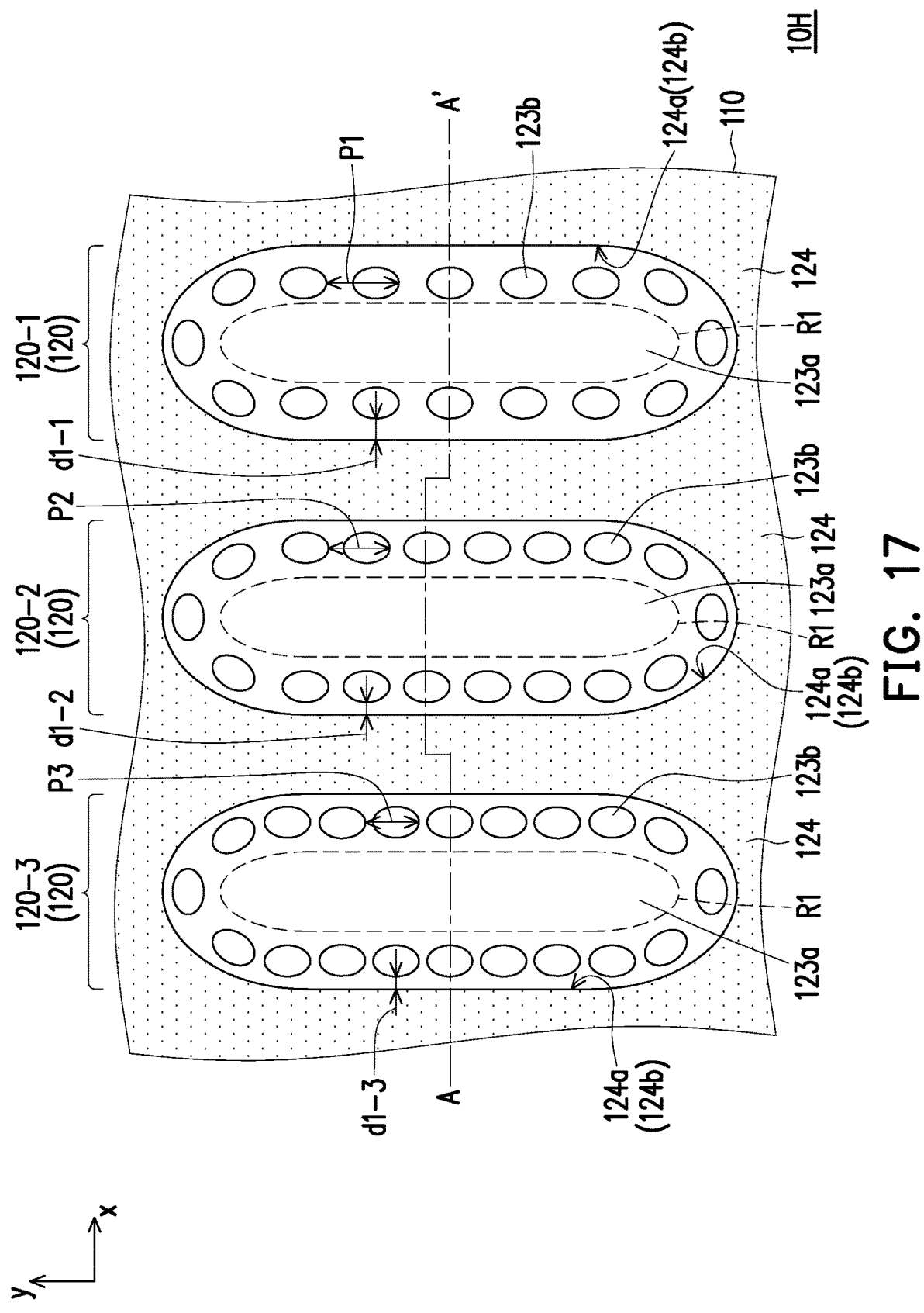
FIG. 17 is a schematic top view of an organic light emitting diode display apparatus according to an embodiment of the invention.
Figure 18:
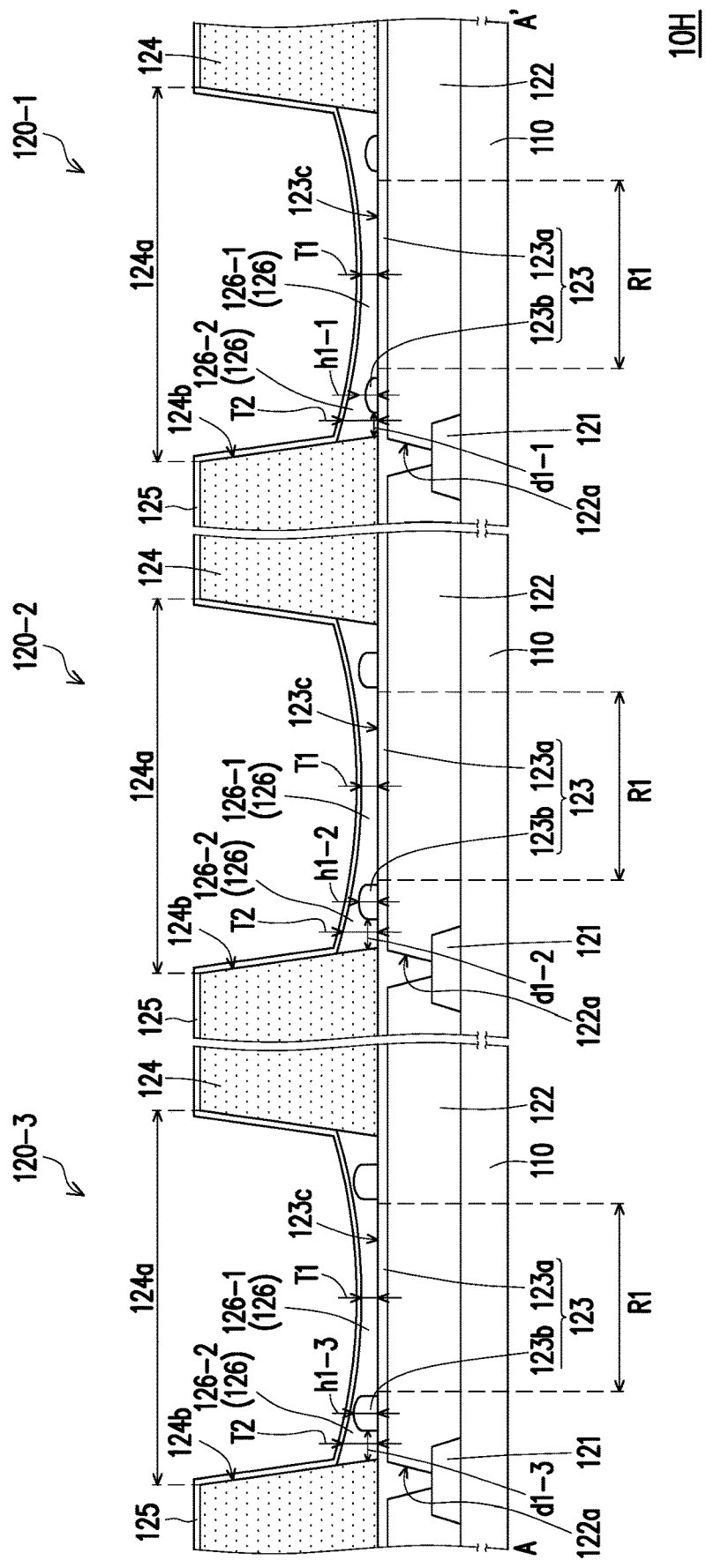
FIG. 18 is a schematic cross-sectional view illustrating the organic light emitting diode display apparatus taken along a cross-sectional line A-A' in FIG. 17.

FIG. 17 is a schematic top view of an organic light emitting diode display apparatus according to an embodiment of the invention. FIG. 18 is a schematic cross-sectional view illustrating the organic light emitting diode display apparatus taken along a cross-sectional line A-A' in FIG. 17. For clarity, illustration of the light emitting layer 126 and the second electrode 125 in FIG. 18 is omitted in FIG. 17.

In the embodiment of FIG. 17 and FIG. 18, an organic light emitting diode display apparatus 10H includes a first pixel structure 120-1, a second pixel structure 120-2, and a third pixel structure 120-3 respectively configured to emit a first color light, a second color light, and a third color light. In this embodiment, the first color light, the second color light, and the third color light may respectively be blue light, green light, and red light, which should however not be construed as limitations to the invention.

In particular, structures of the first pixel structure 120-1, the second pixel structure 120-2, and the third pixel structure 120-3 are not identical. Specifically, the plurality of protrusions 123b of the first pixel structure 120-1 are arranged at a first pitch P1, the plurality of protrusions 123b of the second pixel structure 120-2 are arranged at a second pitch P2, and the plurality of protrusions 123b of the third pixel structure 120-3 are arranged at a third pitch P3. In this embodiment, the first pitch P1 is greater than the second pitch P2, and the second pitch P2 is greater than the third pitch P3. For instance, the first pitch P1 may be 2 μm, the second pitch P2 may be 1.5 μm, and the third pitch P3 may be 1 μm, which should however not be construed as limitations to the invention.

Note that in this embodiment, the material of the light emitting layer 126 of the first pixel structure 120-1, the material of the light emitting layer 126 of the second pixel structure 120-2, and the material of the light emitting layer 126 of the third pixel structure 120-3 are not identical. For instance, a fluid drop concentration configured to form the light emitting layer 126 of the third pixel structure 120-3 is greater than a fluid drop concentration configured to form the light emitting layer 126 of the second pixel structure 120-2, and the fluid drop concentration configured to form the light emitting layer 126 of the second pixel structure 120-2 is greater than a fluid drop concentration configured to form the light emitting layer 126 of the first pixel structure 120-1. The fluid drop concentrations configured to form the light emitting layer 126 of the first pixel structure 120-1, the light emitting layer 126 of the second pixel structure 120-2, and the light emitting layer 126 of the third pixel structure 120-3 are different. Nevertheless, as P1>P2>P3, film thickness uniformity of the light emitting layer 126 of the first pixel structure 120-1, film thickness uniformity of the light emitting layer 126 of the second pixel structure 120-2, and film thickness uniformity of the light emitting layer 126 of the third pixel structure 120-3 are close, so that optical performance of the organic light emitting diode display apparatus 10H is enhanced.

With reference to FIG. 17 and FIG. 18, in this embodiment, a distance d1-1 between one protrusion 123b of the first pixel structure 120-1 and the side wall 124b of the bank layer 124 is greater than a distance d1-2 between one protrusion 123b of the second pixel structure 120-2 and the side wall 124b of the bank layer 124. The distance d1-2 between one protrusion 123b of the second pixel structure 120-2 and the side wall 124b of the bank layer 124 and a distance d1-3 between one protrusion 123b of the third pixel structure 120-3 and the side wall 124b of the bank layer 124 may selectively be identical. For instance, the distance d1-1 may be 1.5 μm, the distances d1-2 and d1-3 may be 1 μm, which should however not be construed as limitations to the invention.

Similarly, since the distance d1-1 is greater than the distance d1-2, even though the fluid drop concentration configured to form the light emitting layer 126 of the first pixel structure 120-1 is less than the fluid drop concentration configured to form the light emitting layer 126 of the second pixel structure 120-2, the film thickness uniformity of the light emitting layer 126 of the first pixel structure 120-1 is close to the film thickness uniformity of the light emitting layer 126 of the second pixel structure 120-2, so that optical performance of the organic light emitting diode display apparatus 10H is enhanced.

With reference to FIG. 18, one protrusion 123b of the first pixel structure 120-1 has a first height h1-1, one protrusion 123b of the second pixel structure 120-2 has a second height h1-2, and one protrusion 123b of the third pixel structure 120-3 has a third height h1-3. In this embodiment, the third height h1-3 may be greater than the second height h1-2, and the second height h1-2 may be greater than the first height h1-1, which should however not be construed as limitations to the invention.

Similarly, since third height h1-3 is greater than the second height h1-2 and the second height h1-2 is greater than the first height h1-1, even though the fluid drop concentration configured to form the light emitting layer 126 of the first pixel structure 120-1, the fluid drop concentration configured to form the light emitting layer 126 of the second pixel structure 120-2, and the fluid drop concentration configured to form the light emitting layer 126 of the third pixel structure 120-3 are different from one another, the film thickness uniformity of the light emitting layer 126 of the first pixel structure 120-1, the film thickness uniformity of the light emitting layer 126 of the second pixel structure 120-2, and the film thickness uniformity of the light emitting layer 126 of the third pixel structure 120-3 are relatively close, so that optical performance of the organic light emitting diode display apparatus 10H is enhanced.

Figure 19:
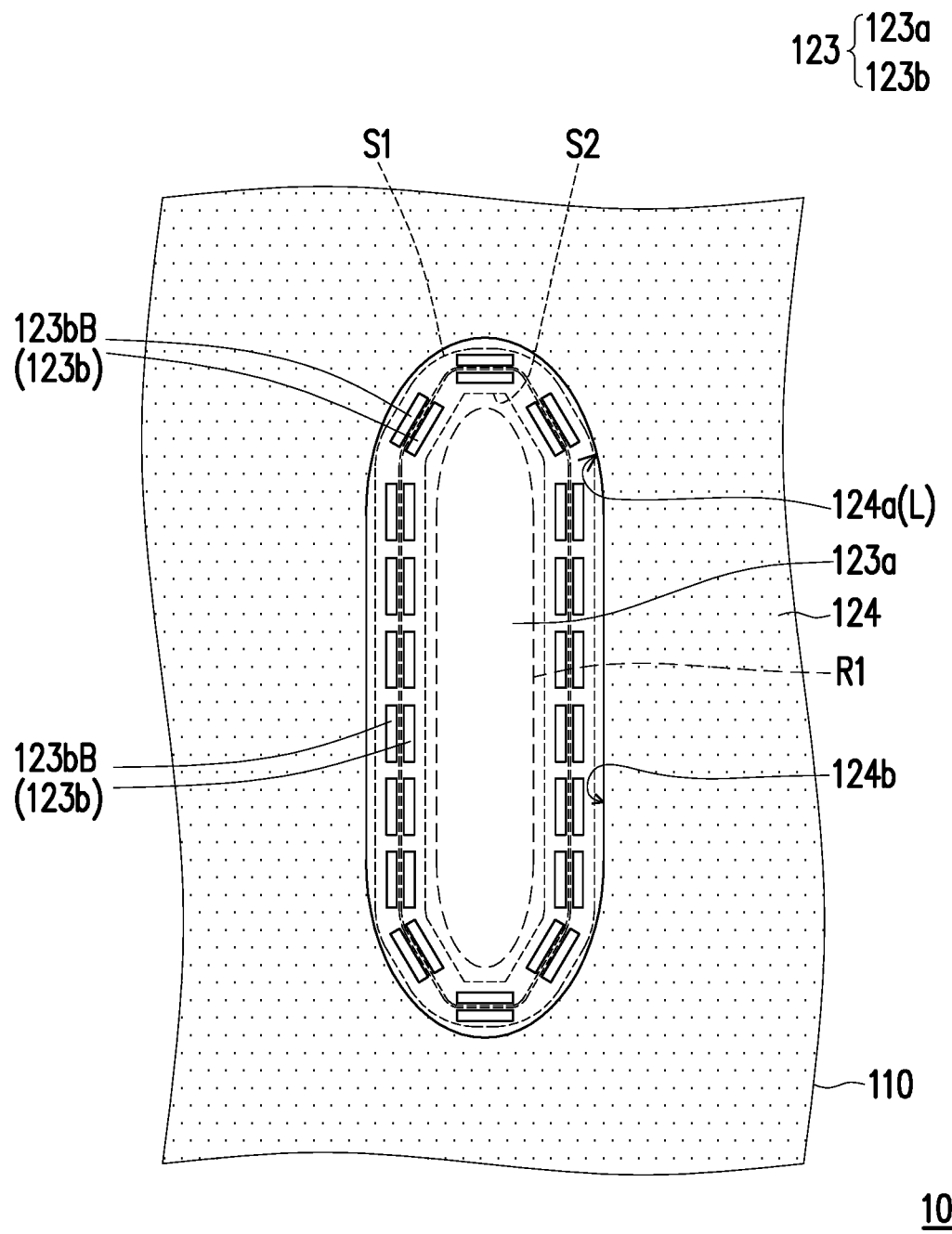
FIG. 19 is a schematic top view of an organic light emitting diode display apparatus according to an embodiment of the invention.

FIG. 19 is a schematic top view of an organic light emitting diode display apparatus according to an embodiment of the invention. For clarity, illustration of a light emitting layer and a second electrode of an organic light emitting diode display apparatus 10I is omitted in FIG. 19.

The organic light emitting diode display apparatus 10I of FIG. 19 is similar to the organic light emitting diode display apparatus 10 of FIG. 1, and a difference therebetween is that: arrangement of the protrusions 123b of the organic light emitting diode display apparatus 10I and arrangement of the protrusions 123b of the organic light emitting diode display apparatus 10 are different. Specifically, the plurality of protrusions 123b of the organic light emitting diode display apparatus 10I include a first protrusion string S1 and a second protrusion string S2. The first protrusion string S1 is located between the side wall 124b of the bank layer 124 and the second protrusion string S2. That is, in the embodiment of FIG. 19, the protrusions 123b of the organic light emitting diode display apparatus 10I may be arranged into a plurality of circles along the boundary edge L.

Figure 20:
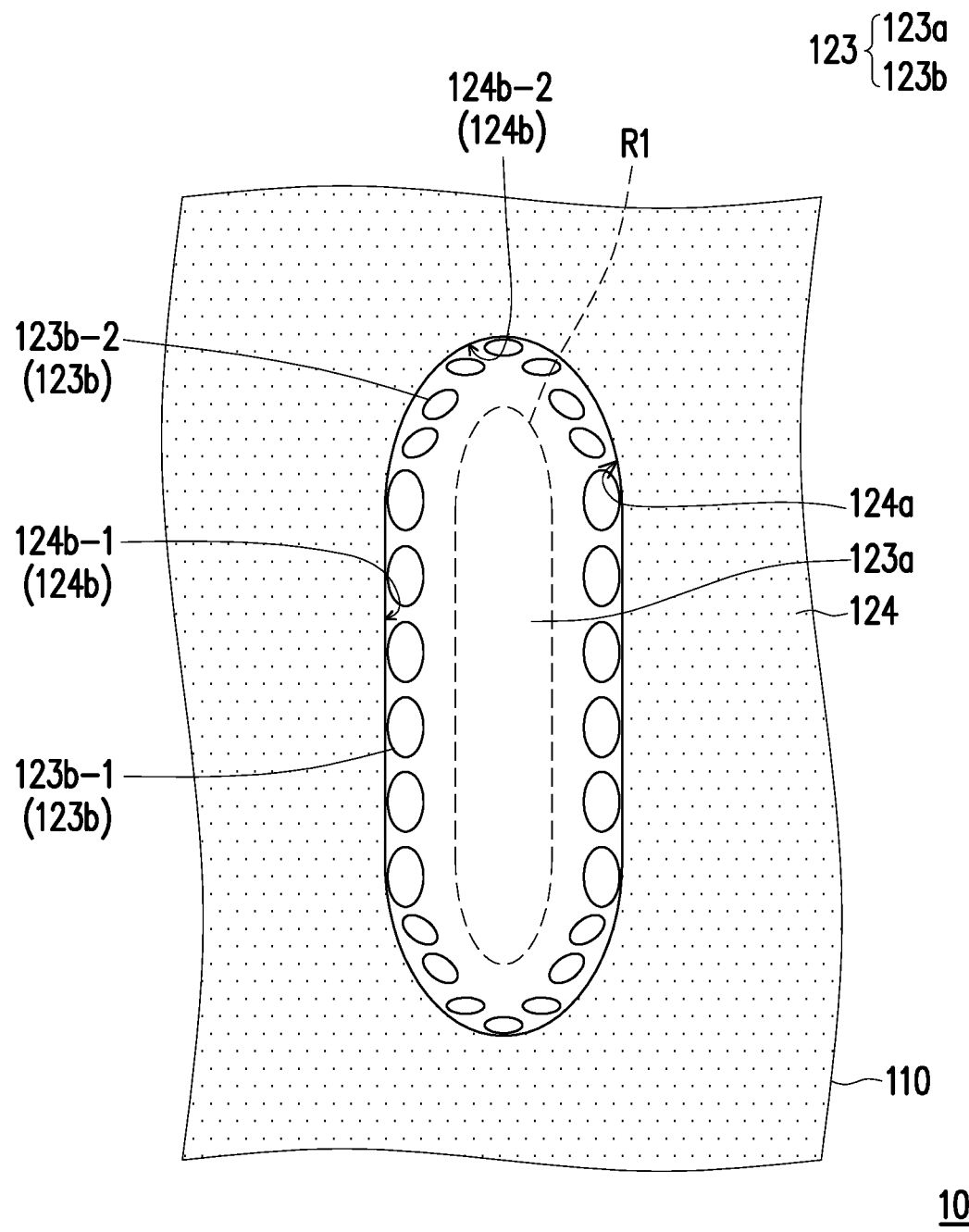
FIG. 20 is a schematic top view of an organic light emitting diode display apparatus according to an embodiment of the invention.

FIG. 20 is a schematic top view of an organic light emitting diode display apparatus according to an embodiment of the invention. For clarity, illustration of a light emitting layer and a second electrode of an organic light emitting diode display apparatus 10J is omitted in FIG. 20.

The organic light emitting diode display apparatus 10J of FIG. 20 is similar to the organic light emitting diode display apparatus 10 of FIG. 1, and a difference therebetween is that: all protrusions 123b are substantially identical in the organic light emitting diode display apparatus 10, and a part of protrusions 123b in the organic light emitting diode display apparatus 10J is different from another part of protrusions 123b in the organic light emitting diode display apparatus 10J. Specifically, in the embodiment of FIG. 20, the vertical projection area of one protrusion 123b-1 disposed adjacent to the first portion 124b-1 of the side wall 124b on the substrate 110 may selectively be greater than the vertical projection area of another protrusion 123b-2 disposed adjacent to the second portion 124b-2 of the side wall 124b on the substrate 110.

Figure 21:
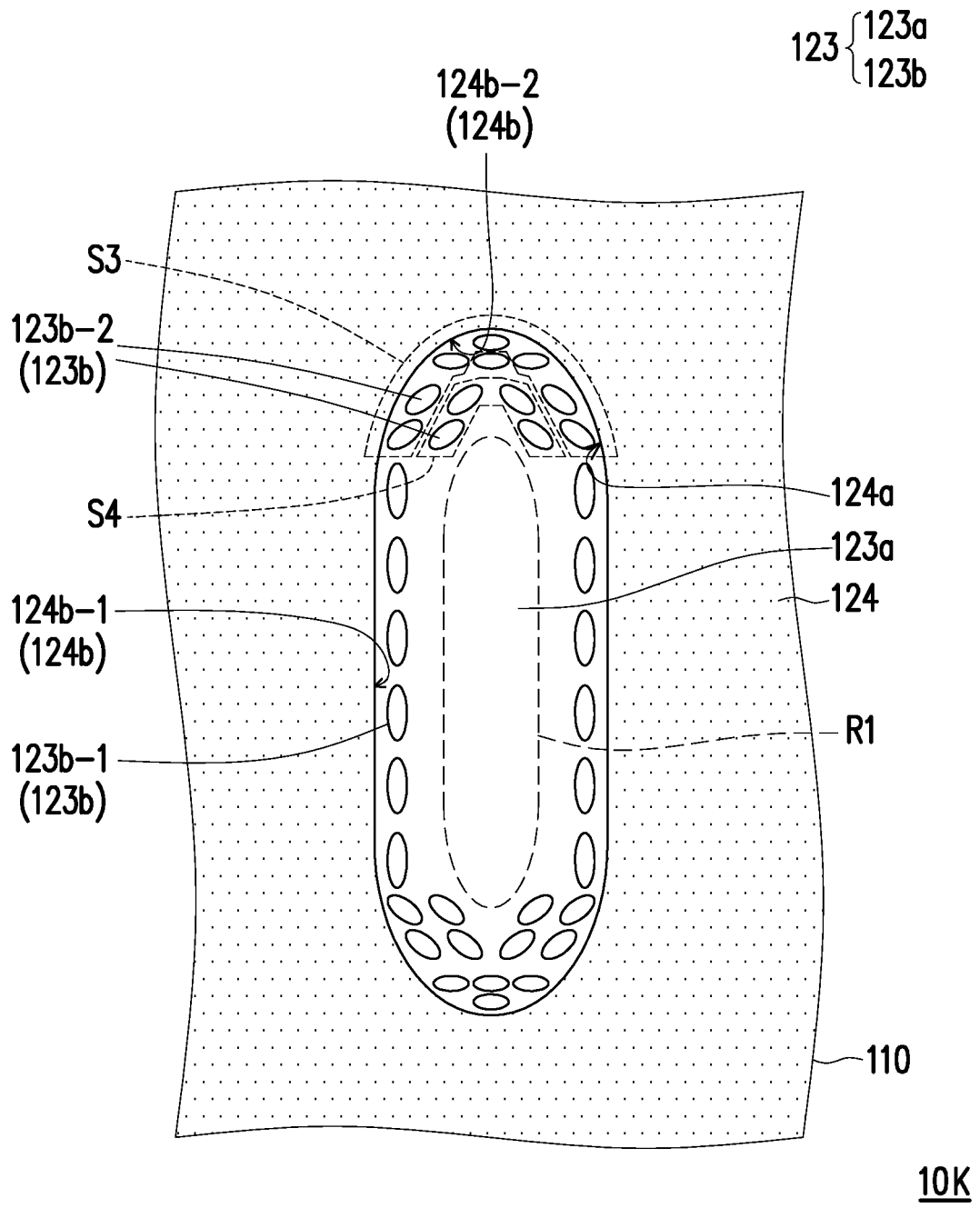
FIG. 21 is a schematic top view of an organic light emitting diode display apparatus according to an embodiment of the invention.

FIG. 21 is a schematic top view of an organic light emitting diode display apparatus according to an embodiment of the invention. For clarity, illustration of a light emitting layer and a second electrode of an organic light emitting diode display apparatus 10K is omitted in FIG. 21.

The organic light emitting diode display apparatus 10K of FIG. 21 is similar to the organic light emitting diode display apparatus 10J of FIG. 20, and a difference therebetween is that: the plurality of protrusions 123b-2 disposed adjacent to the second portion 124b-2 of the side wall 124b are arranged into a third protrusion string S3 and a fourth protrusion string S4, and the third protrusion string S3 is located between the second portion 124b-2 of the side wall 124b and the fourth protrusion string S4 in the embodiment of FIG. 21. That is, in the embodiment of FIG. 21, the plurality of protrusions 123b-2 near the second portion 124b-2 of the side wall 124b can be arranged into a plurality of columns in the organic light emitting diode display apparatus 10K.

Figure 22:
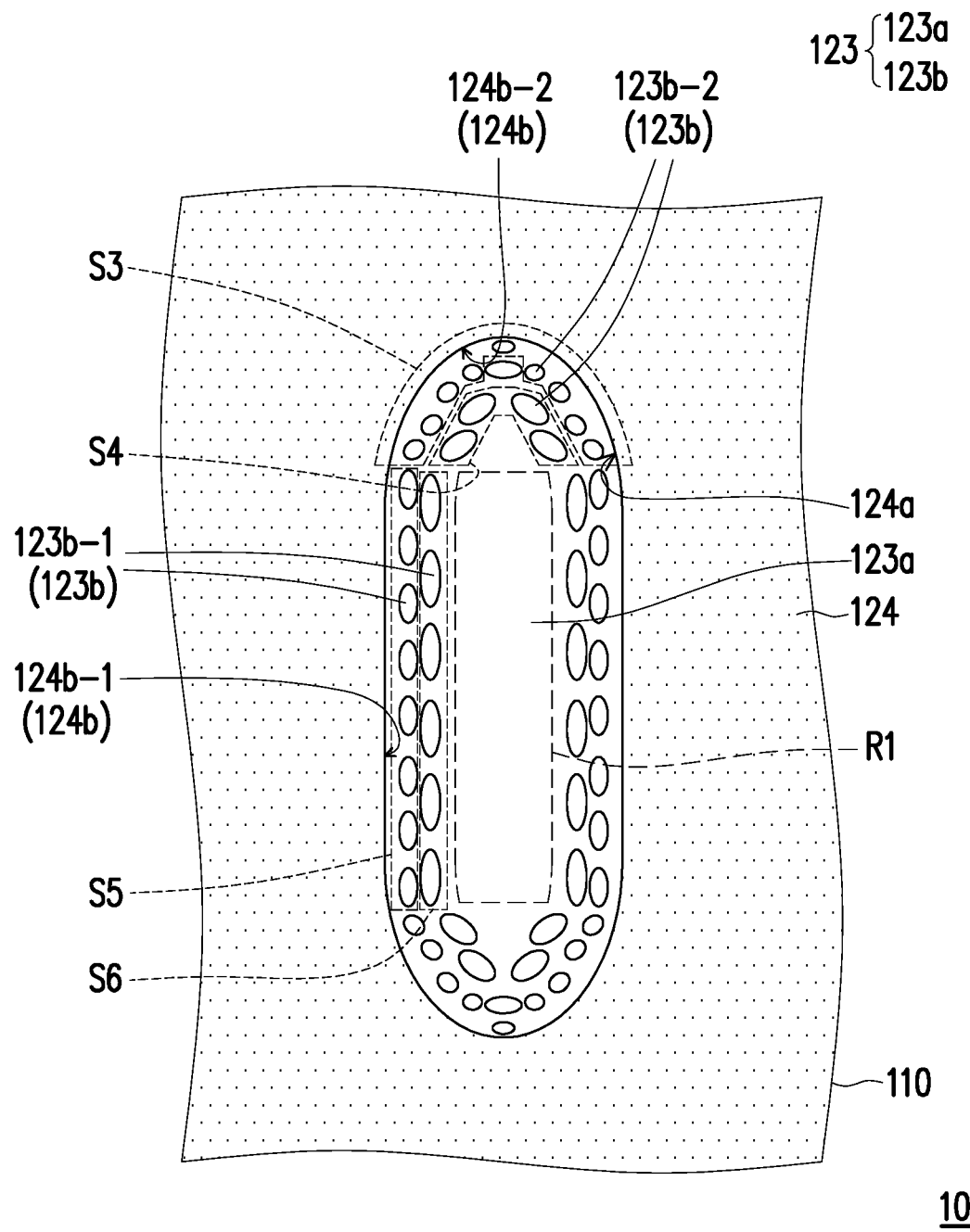
FIG. 22 is a schematic top view of an organic light emitting diode display apparatus according to an embodiment of the invention.

FIG. 22 is a schematic top view of an organic light emitting diode display apparatus according to an embodiment of the invention. For clarity, illustration of a light emitting layer and a second electrode of an organic light emitting diode display apparatus 10L is omitted in FIG. 22.

The organic light emitting diode display apparatus 10L of FIG. 22 is similar to the organic light emitting diode display apparatus 10K of FIG. 21, and a difference therebetween is that: the plurality of protrusions 123b-1 disposed adjacent to the first portion 124b-1 of the side wall 124b are arranged into a fifth protrusion string S5 and a sixth protrusion string S6, and the fifth protrusion string S5 is located between the sixth protrusion string S6 and the first portion 124b-1 of the side wall 124b in the embodiment of FIG. 22. That is, in the embodiment of FIG. 22, the plurality of protrusions 123b-2 near the first portion 124b-1 of the side wall 124b can also be arranged into a plurality of columns in the organic light emitting diode display apparatus 10L.

In addition, in the embodiment of FIG. 22, the vertical projection area of one protrusion 123b of the third protrusion string S3 on the substrate 110 may selectively be less than the vertical projection area of one protrusion 123b of the fourth protrusion string S4 on the substrate 110, and the vertical projection area of one protrusion 123b of the fifth protrusion string S5 on the substrate 110 may selectively be less than the vertical projection area of one protrusion 123b of the sixth protrusion string S6 on the substrate 110. That is, in the embodiment of FIG. 22, the vertical projection areas of the protrusions 123b on the substrate 110 may increase along with an increase in distance between the protrusions 123b and the side wall 124b, which should however not be construed as limitations to the invention.

Figure 23:
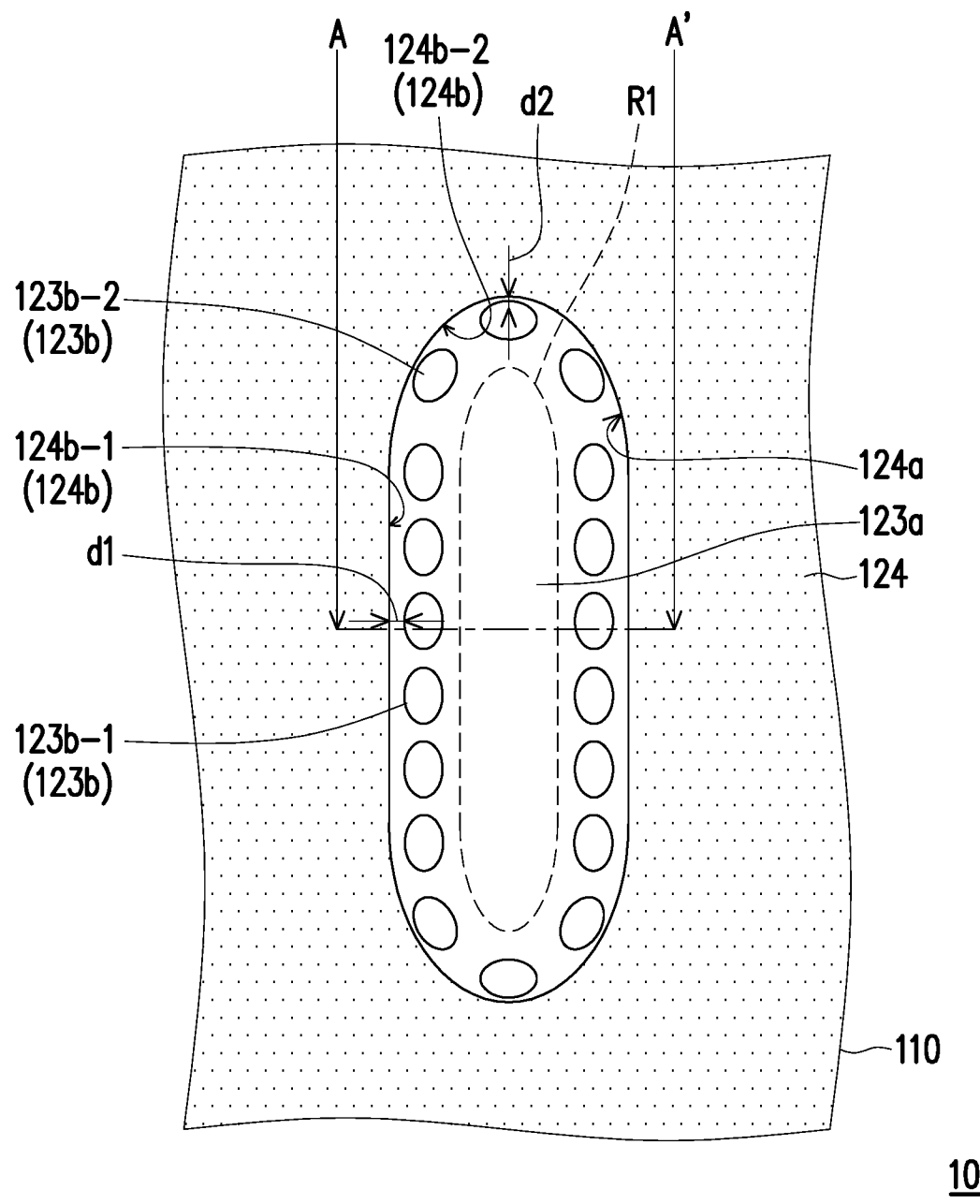
FIG. 23 is a schematic top view of an organic light emitting diode display apparatus according to an embodiment of the invention.
Figure 24:
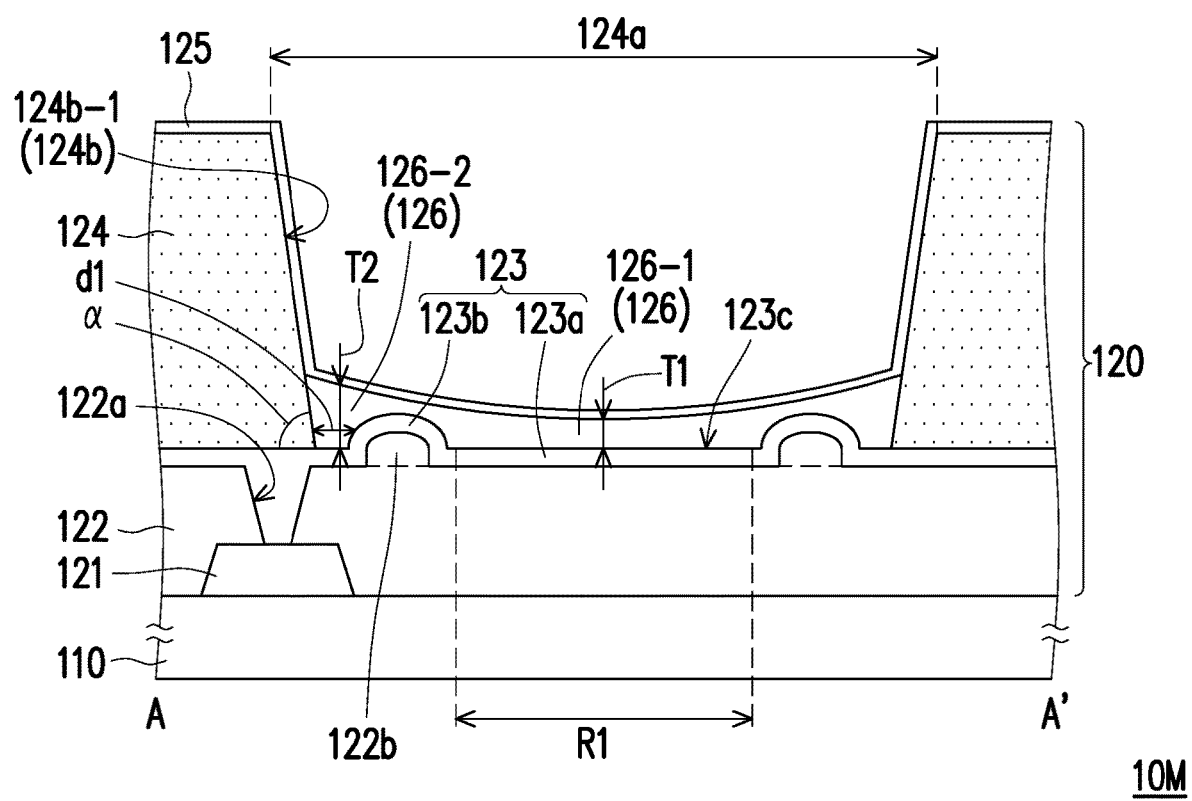
FIG. 24 is a schematic cross-sectional view illustrating the organic light emitting diode display apparatus taken along a cross-sectional line A-A' in FIG. 23.

FIG. 23 is a schematic top view of an organic light emitting diode display apparatus according to an embodiment of the invention. FIG. 24 is a schematic cross-sectional view illustrating the organic light emitting diode display apparatus taken along a cross-sectional line A-A' in FIG. 23. For clarity, illustration of the light emitting layer 126 and the second electrode 125 in FIG. 24 is omitted in FIG. 23.

An organic light emitting diode display apparatus 10M of FIG. 23 and FIG. 24 is similar to the organic light emitting diode display apparatus 10 of FIG. 1 and FIG. 2, and a difference therebetween is that: protrusions 122b are provided on an insulation layer 122, and the first electrode 123 is disposed on the insulation layer 122 so that the first electrode 123 includes the plurality of protrusions 123b disposed corresponding to the protrusions 122b of the insulation layer 122 in the organic light emitting diode display apparatus 10M. In this embodiment, the protrusions 123b of the first electrode 123 overlap with the protrusions 122b of the insulation layer 122.

The insulation layer 122 having the plurality of protrusions 122b and the first electrode 123 on the insulation layer 122 in the organic light emitting diode display apparatus 10M may be configured to replace the insulation layer 122 and the first electrode 123 in the organic light emitting diode display apparatus 10A, 10B, 10C, 10D, 10E, 10F, 10G, 10H, 10I, 10J, 10K, or 10L of any embodiment. The organic light emitting diode display apparatus formed through such replacement manner also falls within the scope sought to be protected by the invention.

In view of the foregoing, the organic light emitting diode display apparatus provided by an embodiment of the invention includes the substrate and the plurality of pixel structures disposed on the substrate. At least one of the pixel structures includes the active element, the first electrode electrically connected to the active element, the bank layer disposed on the first electrode and having the opening, the light emitting layer disposed on the first electrode and the opening of the bank layer, and the second electrode disposed on the light emitting layer. In particular, the bank layer has the side wall defining the opening, and the first electrode has the plurality of protrusions near the side wall of the bank layer. The micro gaps are formed between the protrusions of the first electrode and the side wall of the bank layer. Through the capillarity effect of the micro gaps, an increasing amount of fluid drops configured to form the light emitting layer is kept inside the micro gaps, so that the film thickness of the portion of the light emitting layer near the side wall of the bank layer is reduced. In this way, the light emitting layer may exhibit a relatively uniform film thickness, and the organic light emitting diode display apparatus may therefore feature favorable optical performance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An organic light emitting diode display apparatus, comprising:
   a substrate; and
   a plurality of pixel structures, disposed on the substrate, wherein at least one of the pixel structures comprises:
      an active element;
      a first electrode, electrically connected to the active element, having a first region and a plurality of protrusions disposed outside the first region;
      a bank layer, disposed on the first electrode, having an opening and a side wall defining the opening, wherein the opening of the bank layer overlaps with the first region and the plurality of protrusions that are protrusions of the first electrode, and the protrusions are disposed adjacent to a periphery of the opening and away from a center of the opening;
      a light emitting layer, disposed on the first electrode and the opening of the bank layer, wherein the light emitting layer comprises a first portion and a second portion, the first portion is disposed on the first region of the first electrode, the second portion of the light emitting layer is disposed between the protrusions of the first electrode and the side wall of the bank layer, and a film thickness of the second portion of the light emitting layer is greater than a film thickness of the first portion of the light emitting layer; and
      a second electrode, disposed on the light emitting layer.

2. The organic light emitting diode display apparatus as claimed in claim 1, wherein a boundary edge is provided between the side wall of the bank layer and a surface of the first electrode, and the protrusions are disposed at intervals along the boundary edge.

3. The organic light emitting diode display apparatus as claimed in claim 1, wherein the protrusions comprise a first protrusion string and a second protrusion string, and the first protrusion string is disposed between the side wall of the bank layer and the second protrusion string.

4. The organic light emitting diode display apparatus as claimed in claim 1, wherein the side wall of the bank layer comprises a first portion and a second portion, a first included angle is provided between the first portion of the side wall and a surface of the first electrode, a second included angle is provided between the second portion of the side wall and the surface of the first electrode, and the first included angle is greater than the second included angle; a first distance is provided between the first portion of the side wall and one of the protrusions disposed adjacent to the first portion of the side wall, a second distance is provided between the second portion of the side wall and another one of the protrusions disposed adjacent to the second portion of the side wall, and the second distance is less than the first distance.

5. The organic light emitting diode display apparatus as claimed in claim 1, wherein the side wall of the bank layer comprises a first portion and a second portion, a first included angle is provided between the first portion of the side wall and a surface of the first electrode, a second included angle is provided between the second portion of the side wall and the surface of the first electrode, and the first included angle is greater than the second included angle; one of the protrusions disposed adjacent to the first portion of the side wall has a first height, another one of the protrusions disposed adjacent to the second portion of the side wall has a second height, and the second height is greater than the first height.

6. The organic light emitting diode display apparatus as claimed in claim 1, wherein the at least one of the pixel structures comprises a first pixel structure emitting a first color light and a second pixel structure emitting a second color light, a plurality of protrusions of the first pixel structure are arranged at a first pitch, a plurality of protrusions of the second pixel structure are arranged at a second pitch, and the first pitch is greater than the second pitch.

7. The organic light emitting diode display apparatus as claimed in claim 6, wherein the at least one of the pixel structures further comprises a third pixel structure configured for emitting a third color light, a plurality of protrusions of the third pixel structure are arranged at a third pitch, and the second pitch is greater than the third pitch.

8. The organic light emitting diode display apparatus as claimed in claim 1, wherein the at least one of the pixel structures comprises a first pixel structure emitting a first color light and a second pixel structure emitting a second color light, a distance between one of the protrusions of the first pixel structure and the side wall of the bank layer is greater than a distance between one of the protrusions of the second pixel structure and the side wall of the bank layer.

9. The organic light emitting diode display apparatus as claimed in claim 1, wherein the at least one of the pixel structures comprises a first pixel structure configured for emitting a first color light and a second pixel structure configured for emitting a second color light, one of a plurality of protrusions of the first pixel structure has a first height, one of a plurality of protrusions of the second pixel structure has a second height, and the second height is greater than the first height.

10. The organic light emitting diode display apparatus as claimed in claim 1, wherein the side wall of the bank layer comprises a first portion and a second portion, a first included angle is provided between the first portion of the side wall and a surface of the first electrode, a second included angle is provided between the second portion of the side wall and the surface of the first electrode, and the first included angle is greater than the second included angle; a vertical projection area of one of the protrusions disposed adjacent to the first portion of the side wall on the substrate is greater than a vertical projection area of another one of the protrusions disposed adjacent to the second portion of the side wall on the substrate.

11. The organic light emitting diode display apparatus as claimed in claim 1, wherein the side wall of the bank layer comprises a first portion and a second portion, a first included angle is provided between the first portion of the side wall and a surface of the first electrode, a second included angle is provided between the second portion of the side wall and the surface of the first electrode, and the first included angle is greater than the second included angle; plural protrusions of the protrusions disposed adjacent to the second portion of the side wall are arranged into a third protrusion string and a fourth protrusion string, and the third protrusion string is located between the fourth protrusion string and the second portion of the side wall.

12. The organic light emitting diode display apparatus as claimed in claim 11, wherein a vertical projection area of one protrusion of the third protrusion string on the substrate is less than a vertical projection area of one protrusion of the fourth protrusion string on the substrate.

13. The organic light emitting diode display apparatus as claimed in claim 11, wherein plural protrusions of the protrusions disposed adjacent to the first portion of the side wall are arranged into a fifth protrusion string and a sixth protrusion string, and the fifth protrusion string is located between the sixth protrusion string and the first portion of the side wall.

14. The organic light emitting diode display apparatus as claimed in claim 13, wherein a vertical projection area of one protrusion of the fifth protrusion string on the substrate is less than a vertical projection area of one protrusion of the sixth protrusion string on the substrate.

15. The organic light emitting diode display apparatus as claimed in claim 1, wherein the at least one of the pixel structures further comprises:
an insulation layer, disposed on the substrate and having a plurality of protrusions, wherein the insulation layer is located between the first electrode and the substrate, and the protrusions of the first electrode are disposed corresponding to the protrusions of the insulation layer.

16. The organic light emitting diode display apparatus as claimed in claim 1, wherein the first region of the first electrode is formed of a conductive material.

17. The organic light emitting diode display apparatus as claimed in claim 1, wherein a material of the protrusions comprises a conductive material.

18. The organic light emitting diode display apparatus as claimed in claim 1, wherein a plurality of gaps is provided between the protrusions and the side wall of the bank layer.

* * * * *